(12) United States Patent
Liu et al.

(10) Patent No.: US 8,644,358 B2
(45) Date of Patent: Feb. 4, 2014

(54) HIGHLY POWER-EFFICIENT AND BROADBAND QUANTUM CASCADE LASERS

(76) Inventors: Qiang Liu, Princeton, NJ (US); Yu Yao, Princeton, NJ (US); Anthony J. Hoffman, Leonardtown, MD (US); Matthew Escarra, Princeton, NJ (US); Kale J. Franz, Burlington, CO (US); Jacob Khurgin, Pikeville, MD (US); Yamac Dikmelik, Silver Spring, MD (US); William O. Charles, Lawreceville, NJ (US); Jianxin Chen, Shanghai (CN); Claire F. Gmachl, Princeton, NJ (US)

( * ) Notice: Subject to any disclaimer, the term of this patent is extended or adjusted under 35 U.S.C. 154(b) by 50 days.

(21) Appl. No.: 12/795,954

(22) Filed: Jun. 8, 2010

(65) Prior Publication Data

US 2011/0080930 A1    Apr. 7, 2011

Related U.S. Application Data

(60) Provisional application No. 61/185,182, filed on Jun. 8, 2009.

(51) Int. Cl.
*H01S 5/34*    (2006.01)
*H01S 5/343*    (2006.01)

(52) U.S. Cl.
USPC .................................. 372/45.012; 372/45.01

(58) Field of Classification Search
USPC ................. 372/45.012, 43.01, 45.01
See application file for complete search history.

(56) References Cited

U.S. PATENT DOCUMENTS

2006/0215718 A1*    9/2006   Yasuda et al. ............ 372/45.012

OTHER PUBLICATIONS

Capasso et al. ("High-performance superlattice quantum cascade lasers", JQE, vol. 5, No. 3, May/Jun. 1999).*
Offermans, P. et al. Digital alloy interface grading of an InAlAs/InGaAs quantum cascade laser structure studied by cross-sectional scanning tunneling microscopy. Appl. Phys. Lett. 83, 4131-4133 (2003). NPL_021.
Sirtori, C. et al. Resonant tunneling in quantum cascade lasers. IEEE J. Quantum Electron. 34, 1722-1729 (1998). NPL_022.
Wang, Q. J. et al. High performance quantum cascade lasers based on three-phonon-resonance design. Appl. Phys. Lett. 94, 011103 (2009). NPL_023.
Gmachl, C., Capasso, F., Sivco, D. L. & Cho, A. Y. Recent progress in quantum cascade lasers and applications. Rep. Prog. Phys. 64, 1533-1601 (2001). NPL_024.
Wittman, A., et al., Intersubband linewidths in quantum cascade laser designs, Appl, Phys. Lett. 93 141103 (2008). NPL_025.
Wittman, A., et al. Heterogeneous High-Performance Quantum-Cascade Laser Sources for Broad-Band Tuning, Journal of Quantum Electronics, vol. 44, No. 11, Nov. 2008. NPL_026.
C. Faugeras, et al., "High-Power Room Temperature Emission Quantum Cascade Lasers at lambda = 9 microns,"IEEE J. Quantum Electron, vol. 41, pp. 1430-1438 (Dec. 2005). NPL_027.

(Continued)

*Primary Examiner* — Jessica Stultz
*Assistant Examiner* — Michael Carter
(74) *Attorney, Agent, or Firm* — Niels Haun; Dann, Dorfman, Herrell & Skillman, PC

(57) ABSTRACT

The present invention relates generally to highly power-efficient quantum cascade sources, such as highly power-efficient quantum cascade lasers having ultra-strong coupling between injector and active regions which may be configured to provide broadband quantum cascade lasers.

17 Claims, 19 Drawing Sheets

(56) References Cited

OTHER PUBLICATIONS

A. Evans, et al., "Buried heterostructure quantum cascade lasers with high continuous-wave wall plug efficiency," Appl. Phys. Lett., vol. 91, 071101 (2007). NPL__028.

Z. Liu, et al., "Very Small (<1.2-1.7W) Heath Dissipation, Room Temperature, Continuous-Wave Quantum Cascade Lasers at lambda ~ 5.3 microns," CLEO/QELS 2008. NPL__029.

A. Hoffman, et al., "Low voltage-defect quantum cascade laser with heterogeneous injector regions," Nov. 26, 2007, vol. 15, No. 24, Optics Express 15818. NPL__030.

Faist, J., et al., "Quantum Casade Laser", Science, New Series, vol. 264, No. 5158, Apr. 22, 1994, pp. 553-556.

Gmachl, C., et al., "Ultra-broadband Semiconductor Laser", Nature, vol. 415, Feb. 21, 2002, pp. 883-887.

Bai, Y., et al., "Room Temperature Continious Wave Operation of Quantum Cascade Lasers with 12.5% Wall Plug Efficiency", Applied Physics Letters 93, 021103 (2008), 3 pages.

Faist, J., et al., "Quantum-Cascade Lasers Based on a Bound-to-Continuum Transition", Applied Physics Letters, vol. 78, No. 2, Jan. 8, 2001, pp. 147-149.

Faist, J., et al., "Bound-to-Continuum and Two-Phonon Resonance Quantum-Cascade Lasers for High Duty Cycle, High-Temperature Operation", Journal of Quantum Electronics, vol. 38, No. 6, Jun. 2002, pp. 533-545.

Fujita, K., et al., "High-performance, Homogeneous Broad-Gain Quantum Cascade Lasers Based on Dual-Upper-State Design", Applied Physics Letters 96, 241107 (2010), 3 pages.

Khurgin, J., "Inhomogeneous Origin of the Interface Roughness Broadening of Intersubband Transitions", Applied Physics Letters 93, 091104 (2008), 3 pages.

P. Q. Liu, A. J. Hoffman, M. D. Escarra, K. J. Franz, J. B. Khurgin, Y. Dikmelik, X. Wang, J. Fan and C. F. Gmachl, Nature Photonics 4, 95-98 (2010).

Z. Liu, et al., "Room-Temperature Continuous-Wave Quantum Cascade Lasers Grown by MOCVD Without Lateral Regrowth," Photonics Technology Letters, IEEE, vol. 18, pp. 1347-1349, 2006. NPL__009.

Sirtori, C. et al. Resonant tunneling in quantum cascade lasers. IEEE J. Quantum Electron. 34, 1722-1729 (1998). NPL__010.

Wang, Q. J. et al. High performance quantum cascade lasers based on three-phonon-resonance design. Appl. Phys. Lett. 94, 011103 (2009). NPL__011.

Y. Bai, S. Slivken, S. Darvish and M. Razeghi, Room Temperature Continuous wave Operation of Quantum Cascade Lasers with 12.5% Wall Plug Efficiency. Appl. Phys. Lett. 93, 021103 (2008). NPL__012.

Benjamin G. Lee, Mikhail A. Belkin, Christian Pflügl, Laurent Diehl, Haifei A. Zhang, Ross M. Audet, Jim MacArthur, David P. Bour, Scott W. Corzine, Gloria E. Hofler, Federico Capasso, IEEE Journal of Quantum Electronics 45, 554 (2009). NPL__013.

A. Lyakh, C. Pflügl, L. Diehl, Q. J. Wang, Federico Capasso, X. J. Wang, J. Y. Fan, T. Tanbun-Ek, R. Maulini, A. Tsekoun, R. Go, and C. Kumar N. Patel, Appl. Phys. Lett. 92, 111110 (2008). NPL__014.

G. Wysocki, R. F. Curl, F. K. Tittel, R. Maulini, J. M. Bulliard and J. Faist, Widely Tunable Mode-Hop Free External Cavity Quantum Cascade Laser for High Resolution Spectroscopic Applications, Appl. Phys. B 81, 769 (2005). NPL__015.

Y. Yao, K. Franz, X. Wang, J. Fan, and C. Gmachl, A Widely Voltage-Tunable Quantum Cascade Laser Based on "Two-Step" Coupling, Appl. Phys. Lett. 95, 021105 (2009). NPL__017.

Y. Yao, W. O. Charles, T. Tsai, J. Chen, G. Wysocki and C. F. Gmachl, Broadband Quantum Cascade Laser Gain Medium Based on a "Continuum-to-Bound" Active Region Design, Appl. Phys. Lett. Accepted. NPL__016.

Faist, J. Wallplug efficiency of quantum cascade lasers: critical parameters and fundamental limits. Appl. Phys. Lett. 90, 253512 (2007). NPL__018.

Gresch, T., Giovannini, M., Hoyer, N. & Faist, J. Quantum cascade lasers with large optical waveguides. IEEE Photon. Tech. Lett. 18, 544-546 (2006). NPL__019.

Khurgin, J. B. et al. Role of interface roughness in the transport and lasing characteristics of quantum cascade lasers. Appl. Phys. Lett. 94, 091101 (2009). NPL__020.

* cited by examiner

HIGHLY POWER-EFFICIENT AND BROADBAND QUANTUM CASCADE LASERS

RELATED APPLICATIONS

This application claims the benefit of priority of U.S. Provisional Application No. 61/185,182, filed on Jun. 8, 2009, the entire contents of which application are incorporated herein by reference.

GOVERNMENT LICENSE RIGHTS

This invention was made with government support under Grant No. EECO540832 awarded by the National Science Foundation and Grant No. FA8650-07-1-7708 awarded by the United States Air Force (USAF/AFMC). The government has certain rights in this invention.

FIELD OF THE INVENTION

The present invention relates generally to highly power-efficient quantum cascade sources, and more particularly, but not exclusively, to highly power-efficient quantum cascade lasers having ultra-strong coupling between injector and active regions which may be configured to provide broadband quantum cascade lasers.

BACKGROUND

Quantum Cascade (QC) lasers are ideal mid-infrared semiconductor light sources for molecular detection in applications such as environmental sensing or medical diagnostics. For such applications, researchers have been making great efforts to improve the device performance. Recently, improvements in the wall-plug efficiency (WPE) have been pursued to realize compact, portable, power-efficient, and/or high-power QC laser systems. However, advances were largely incremental, and especially the basic quantum design had remained unchanged for many years, with the WPE yet to reach above 35%. A crucial factor in QC laser performance is the efficient transport of electrons from the injector ground level to the upper laser level in the laser active regions. The stronger the coupling between these two levels, the faster electrons can be transferred into the active region and the better the performance of the device. This transport process was described as limited by the interface-roughness-induced detuning of resonant tunneling in Khurgin, J. B. et al. Role of interface roughness in the transport and lasing characteristics of quantum-cascade lasers, *Appl. Phys. Lett.* 94, 091101 (2009), but this limitation has not been addressed in actual QC lasers.

Quantum Cascade lasers are based on intersubband transitions in semiconductor quantum wells. Photons are generated when electrons transported into the active regions from the preceding injector regions undergo radiative transitions between the upper and lower laser levels and are subsequently extracted into the next injector regions. The electron transport from the injector region to the downstream active region occurs via resonant tunneling between the injector ground level and the upper laser level. The tunneling rate, as well as many other performance related parameters, can be engineered through quantum design, e.g., the design of the coupling strength, which is defined as half of the energy splitting between the injector ground level and the upper laser level when they are in full resonance. Theoretical analyses show that a fast tunneling rate is a critical factor for achieving high laser WPE. On the one hand, the faster the tunneling rate, the higher the maximum operating current density that can be supported, and therefore the higher the current efficiency, i.e., how far above threshold the laser is operated, which is an important factor of the WPE. On the other hand, the internal efficiency also benefits from a faster tunneling rate, because it reduces the electron population in the injector region, and thus minimizes the leakage current from the injector ground level to the lower laser level or the continuum energy levels.

With practical growth techniques, interfaces between adjacent semiconductor layers are not perfectly smooth, but in fact are rather rough on the scale of atomic layer steps of a few Å, which is significant compared to the typical semiconductor layer thicknesses of ~10-50 Å in QC lasers. Furthermore, in the InGaAs/AlInAs/InP material system different interfaces have generally unrelated roughness because the width fluctuations of adjacent barriers and wells are unrelated. As a result, such interface roughness introduces significant detuning to the energy levels in resonance, which plays a crucial role in reducing the tunneling rate between the injector and active regions and thus the laser WPE. This effect has been greatly underestimated until recently, so that conventional designs failed to incorporate an adequate mechanism to reduce its negative influence. This effect has been recently re-evaluated and its importance modeled for laser gain. Theoretical calculations show that the interface-roughness-induced detuning to the resonant tunneling is in fact much larger than the broadening of the radiative transition which had previously been used as the limiting factor for the gain. With the coupling strength in conventional designs, the achieved gain is a factor of 2 to 3 lower than the maximum achievable value. Consequently, there is a need in the art for QC lasers that overcome the loss in gain due to interface-roughness-induced detuning Apart from roughness-induced inefficiencies, broadly tunable QC lasers are ideal candidates for multi-analyte mid-infrared spectroscopy applications; however, the maximum tuning range is usually limited by the inherently narrow linewidth of intersubband transitions. Several techniques have so far been demonstrated to achieve a broad gain spectrum of QC lasers. Heterogeneous cascade designs comprise several sub-stacks optimized for different emission wavelengths; "bound-to-continuum" QC lasers have more than one lower laser state, therefore, generating multiple transitions in the same active region. Both methods achieve broad gain spectra by overlapping multiple optical transitions. Actually, even conventional QC laser designs based on resonant tunnelling from the injector ground state to the upper laser state intrinsically have two optical transitions at slightly different wavelengths. At resonance, the injector state and the upper laser state form a doublet from where two optical transitions to the lower laser state happen in parallel. In traditional designs, the energy splitting at resonance is usually about 5 meV for optimized peak gain and transport properties. Nonetheless, despite these approaches a need remains for broadband QC lasers with increased gain.

SUMMARY OF THE INVENTION

In one of it aspects, the present invention provides new "ultra-strong coupling" QC laser designs which addresses the limiting factor of interface-roughness-induced detuning, leading to QC lasers with unprecedented 40-50% WPE. In this regard, the present invention may provide a quantum cascade source having ultra-strong coupling between injector and active regions. The quantum cascade source may include a plurality of repeat units each including an active region and an injector region having a plurality of barrier layers. The repeat units may be stacked in contact with one another linearly along a direction perpendicular to the layers, with each injector region having an injection barrier having a thickness sufficiently thin to provide a coupling strength of at least about 10 meV between the injector and active regions.

In a further aspect, the present invention provides QC laser designs with two lower injector states, rather than one, strongly coupled with the upper laser state at the operating electric fields. Optical transitions from all three states to the lower laser state contribute to a broad gain spectrum; hence we term such designs as "continuum-to-bound" designs. Exemplary QC laser designs may operate at 7-9 μm with two lower injector states strongly coupled with the upper laser state at the operating electric fields. Optical transitions from these three coupled states contribute to a large gain spectrum width (~250 cm$^{-1}$ full width at half maximum), which enables external cavity tuning of the lasers over 200 cm$^{-1}$. The exemplary lasers show comparable performance to a conventional narrow band design at a similar wavelength with a peak modal gain coefficient of ~10 kA/cm, a slope efficiency ~1 W/A and good temperature performance ($T_0$=170 K) in pulsed mode operation at 295 K.

In yet a further aspect, the present invention provides a QC laser design based on a "continuum-to-continuum" active region operating in the 4-5 μm wavelength region and having a broad gain spectrum (more than 400 cm$^{-1}$) as well as high power efficiency performance. (As used herein the term "continuum-to-continuum" is defined to denote a design with multiple transitions from several upper laser states to a few lower laser states.) A low threshold current density (1.6 kA/cm$^2$), large slope efficiency (4.5 W/A), wall plug efficiency (16.8%) were achieved in pulsed mode operation at 295 K.

BRIEF DESCRIPTION OF THE DRAWINGS

The foregoing summary and the following detailed description of the preferred embodiments of the present invention will be best understood when read in conjunction with the appended drawings, in which.

DETAILED DESCRIPTION OF THE INVENTION

Figure 2:
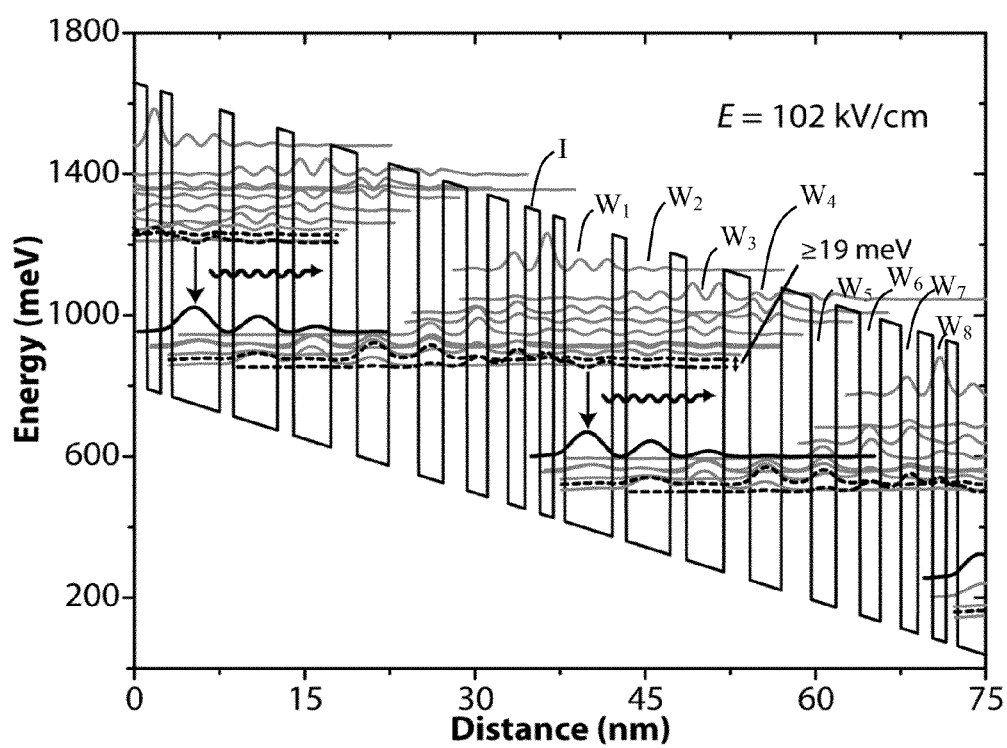
FIG. 2 illustrates a portion of a conduction band diagram of an exemplary configuration of an ultra-strong coupling QC laser design of the present invention, where the pairs of states in bold have a coupling strength of ~10 meV (separation of ~19 meV), and where, starting from the widest quantum well, the layer sequence of one period of the active and injector regions in electron downstream direction with individual thickness in nanometers is 4.2/1.2/3.9/1.4/3.3/2.3/2.8/2.6/2.2/2.1/1.8/1.8/1.5/1.3/1.2/1.0, where the InAlAs barrier layers are in bold, the InGaAs well layers are in roman, and the underlined layers are doped with doping density of 2.3×10$^{17}$ cm$^3$.

In one of its aspects, the present invention provides a new design strategy for QC lasers that employs an ultra-strong coupling between the injector and active regions, FIG. 2. This new design overcomes the interface-roughness-induced detuning of resonant tunneling between the injector ground level and the upper laser level, and more effectively facilitates the electron transport across the quantum cascade and, in turn, greatly improves the QC laser performance, such as power, slope efficiency, and especially WPE. The strength of the coupling between these two levels may be about 10 meV, close to the width of intrinsic transition broadening. An unprecedented 50% WPE is experimentally demonstrated. As used herein the "coupling strength" is defined to be half the energy distance, the "energy splitting", between the states, e.g., the 19 meV energy splitting in FIG. 2 is twice the coupling strength. In another of its aspects, the present invention provides various a broadband QC laser gain designs, using "continuum-to-bound" or "continuum-to-continuum" active region designs in conjunction with ultra-strong coupling.

Figure 1:
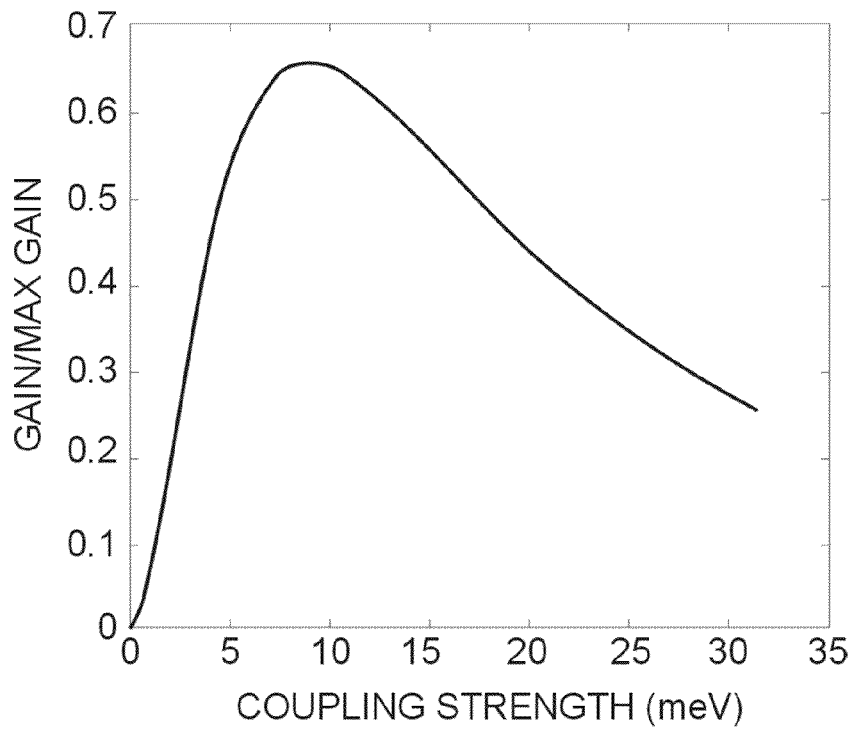
FIG. 1 illustrates the normalized gain coefficient as a function of coupling strength (i.e., half of the energy splitting) between injector level and upper laser level in a QC laser.
Figure 7:
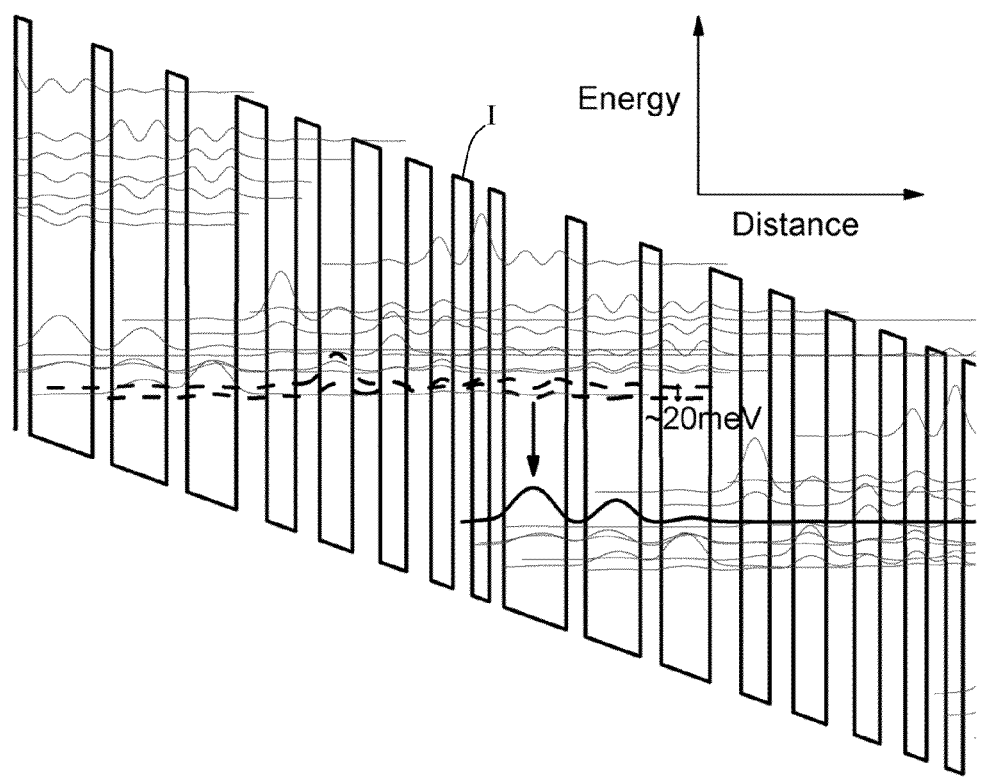
FIG. 7 illustrates a portion of a conduction band diagram of an exemplary configuration of an ultra-strong coupling QC laser design of the present invention with the moduli squared of the relevant wavefunctions at an applied field of 110 kV/cm, where the optical transition is marked by the thick vertical arrow and the energy splitting between the injector ground level and the upper laser level is about 20 meV.

Turning first to the ultra-strong coupling aspect, theoretical calculations indicate that a most straightforward and effective way to obtain optimal gain is to significantly increase the coupling strength between the injector ground level and the upper laser level, with a maximized gain being obtained at a coupling strength of ~10 meV, FIG. 1. An exemplary QC laser design of the present invention, shown in FIG. 2, may then employ a calculated optimal coupling strength of ~10 meV, which is much stronger than those in conventional designs (~2-4 meV). For example, starting from the widest quantum well, $W_1$, the layer sequence of one period of the active and injector regions in electron downstream direction with individual thickness in nanometers is 4.2/1.2/3.9/1.4/3.3/2.3/2.8/2.6/2.2/2.1/1.8/1.8/1.5/1.3/1.2/1.0, where the InAlAs barrier layers are in bold, the InGaAs well layers are in roman, and the underlined layers are doped with doping density of 2.3×10$^{17}$ cm$^{-3}$. The injection barrier is labeled "I". In a similar manner, FIG. 7 illustrates a conduction band diagram of an improved QC laser design having a coupling strength of ~10 meV. From the first thin injection barrier, I, the layer sequence in nanometer is: 1.3/1.2/1.0/4.3/1.3/3.8/1.4/3.4/2.1/2.0/1.6/2.3/1.9/1.8/1.7/1.5, where the InAlAs barrier layers are in bold, the InGaAs well layers are in roman.

The increased coupling strength is achieved by adopting a much thinner injection barrier (~10 Å vs. ~30-40 Å in conventional designs) between the injector and active regions. This ultra-strong coupling effectively overcomes the interface-roughness-induced detuning of resonant tunneling, and leads to a more optimal tunneling current. Another concurrent advantage of this ultra-strong coupling design is that the upper laser level spreads more into the injector region because of the thin injection barrier, so that the radiative transition is more "diagonal" rather than "vertical", which increases the upper laser level lifetime and eventually improves the slope efficiency and decreases the threshold current density. In an exemplary configuration, the injector region is based on five quantum wells, $W_4$-$W_8$, the active region design is based on three quantum wells, $W_1$-$W_3$, and two resonant longitudinal optical phonons scattering is adopted to depopulate the lower laser level.

Ultra-Strong Coupling Exemplary Prototypes

Example 1

Exemplary QC laser structures (and electroluminescent structures) according to the design of FIG. 2 were grown by metal organic chemical vapor deposition (MOCVD) on InP substrate using strain-balanced In$_{0.660}$Ga$_{0.340}$As/Al$_{0.690}$In$_{0.310}$As materials and consisted of a low-loss InP-based waveguide cladding on top of 43 repeats of the injector/active regions sequence. Each injector region had a sheet doping density of 1×10$^{11}$ cm$^{-2}$. Ridge-waveguide lasers were fabricated with ridge widths varying from 13.5-21.5 μm using conventional III-V semiconductor processing techniques. The ridges were wet-etched to ~8 μm deep, a ~0.3 μm SiO$_x$ insulation layer was deposited with PECVD, thin 30/300 nm Ti/Au top metal contacts were deposited through electron-beam evaporation, the substrate was then thinned down to ~200 μm, and a 20/200 nm Ge/Au bottom metal contact was deposited. Exemplary devices with cavity lengths varying from 0.5-4.0 mm and as-cleaved facets were mounted epitaxial-side up to copper heat sinks.

Figure 3A:
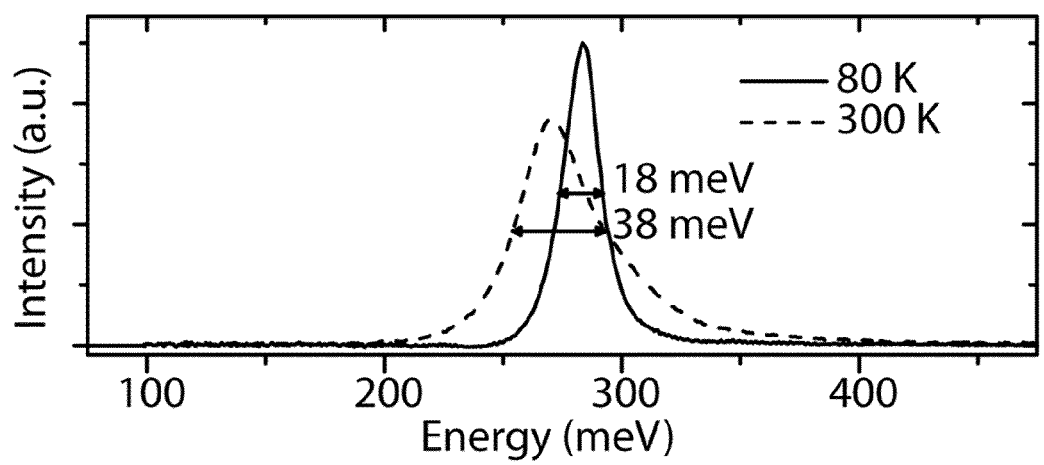
FIGS. 3A, 3B illustrate electroluminescence spectra and laser spectra for an exemplary QC structures fabricated according to the design of FIG. 2, respectively, with FIG. 3A showing electroluminescence spectra of the QC structure at 80 K and 300 K with extracted full width at half maximum values, and FIG. 3B showing exemplary laser spectra at 80 K and 300 K.
Figure 3B:
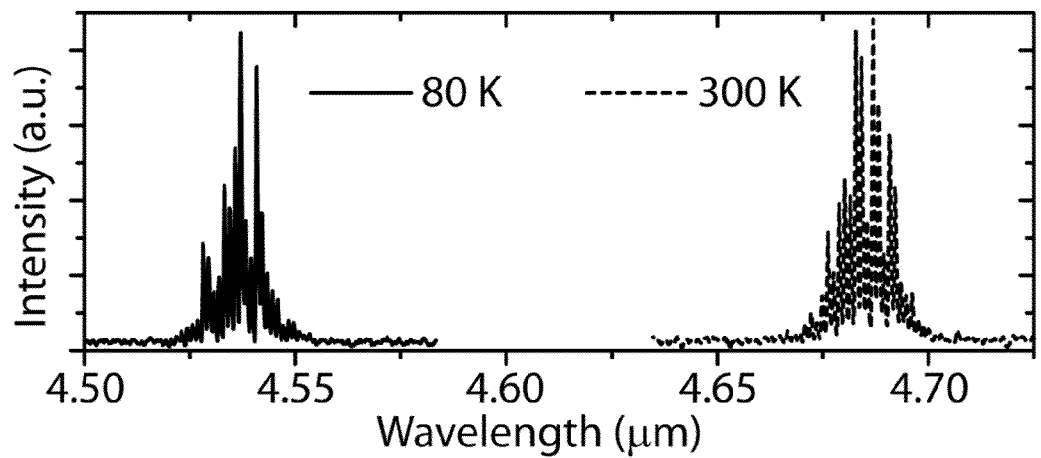
Figure 4A:
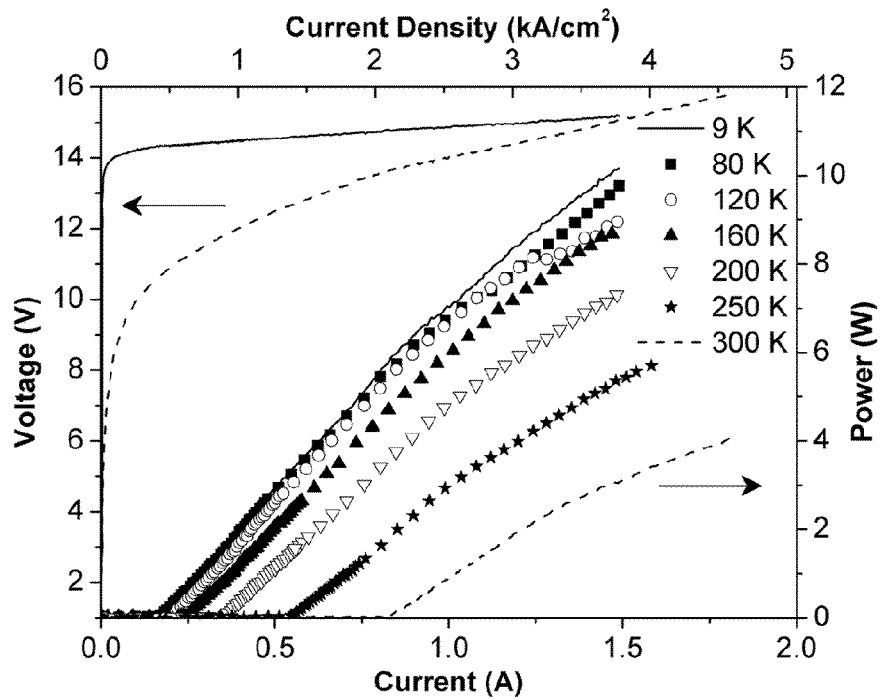
FIGS. 4A, 4B illustrate pulsed light-current-voltage measurements and extracted WPE, respectively, with FIG. 4A showing pulsed light-current-voltage measurements for an as-cleaved 13.6 μm wide, 2.9 mm long QC laser at various heat sink temperatures as indicated, where the measured single-facet optical power is doubled for two facets and corrected for optical collection efficiency (a process tested to be valid for as-cleaved Fabry-Perot QC lasers), and FIG. 4B showing the WPE versus current extracted from the experimental results in FIG. 4A.
Figure 4B:
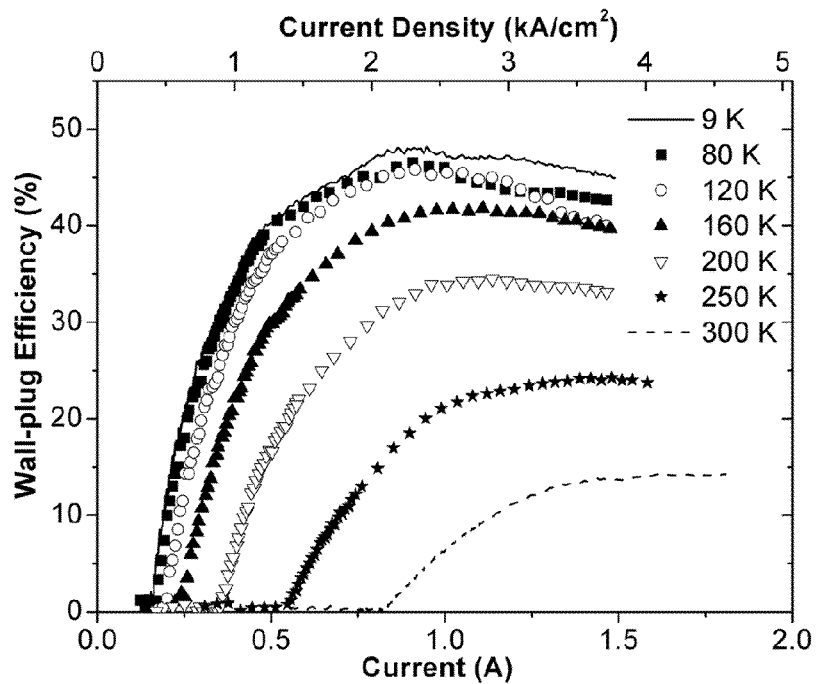

Electroluminescence (EL) structures were fabricated as deep-etched, 200 μm diameter mesas with Ti/Au (230/2300 Å) top and Ge/Au (230/2300 Å) bottom contacts. The mesas were mounted to a copper heat sink. FIG. 3A shows the electroluminescence spectra of a mesa sample at 80 K and 300 K, respectively. The peak positions were 284 meV at 80 K and 271 meV at 300 K, respectively; the full width at half maximum (FWHM) values were 18 meV at 80 K and 38 meV at 300 K, respectively. Contrary to expectations, the ultra-strong coupling in this design shows no obvious, if any, negative impact on the gain profile. The radiative transition broadening is similar to that of the best comparable conventional designs, FIG. 3A. The experimental results also show significant improvements in slope efficiency, peak power and WPE of the lasers compared to those of the best reported QC lasers at similar wavelengths and operating conditions. Representative laser spectra of devices fabricated according to the design of FIG. 2 are shown in FIG. 3B; the lasing wavelength was ~4.5 μm at cryogenic temperatures and ~4.7 μm at room temperature. For pulsed mode operation (5 kHz repetition rate, 100 ns pulse width), one of the best performing lasers (a 13.6 μm wide and 2.9 mm long ridge) had a slope efficiency of ~8 W/A, at least ~10.0 W peak optical output power, FIG. 4A, and a peak WPE of 47% at 80 K, FIG. 4B. The WPE further increased to greater than 48% at 9 K. Taking into account the 0.35Ω measured wiring resistance from the power source to the laser, the laser reached 50% WPE at 9 K. At 80 K, this laser had a threshold current density of 0.42 kA/cm2, and at 300 K the threshold current density was 2.07 kA/cm2 and the peak wall-plug efficiency was ~14%. The characteristic temperature $T_0$ was extracted to be ~125 K, suggesting significant thermal backfilling at higher temperatures.

Figure 5:
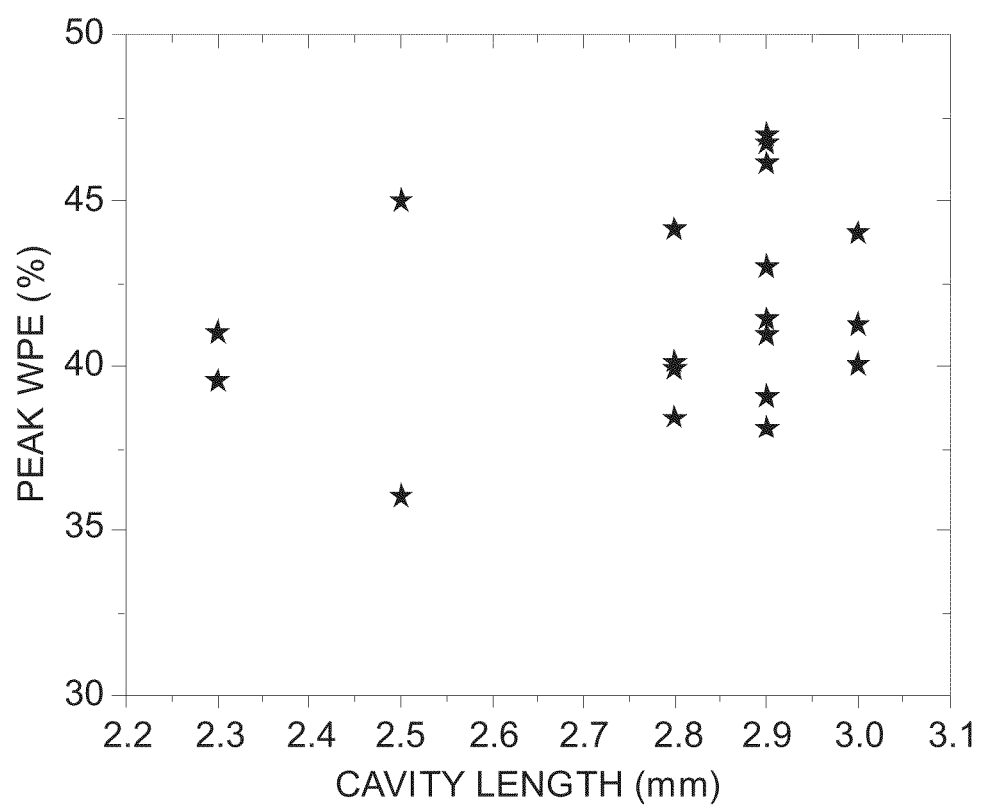
FIG. 5 illustrates a scatter plot of pulsed peak WPE at 80 K for all tested lasers with cavity lengths ranging from 2.3-3.0 mm, where the majority of the tested devices in this cavity length range had a peak WPE greater than 40% at 80 K, and several of them had a peak WPE greater than 45%.

FIG. 5 shows a scatter plot of the peak WPE at 80 K for all the tested lasers with cavity lengths varying from 2.3-3.0 mm. The majority of the tested devices in this cavity length range had a peak WPE greater than 40% at 80 K, several of them had a peak WPE greater than 45% (FIG. 5 is not corrected for the wiring resistance). These results are a significant improvement compared to the best reported results, and surpass the WPE limit predicted for conventional QC lasers. A low waveguide loss of ~1.5 cm$^1$ was extracted from "1/L" measurements, which was also helpful for achieving a high laser WPE.

Figure 6A:
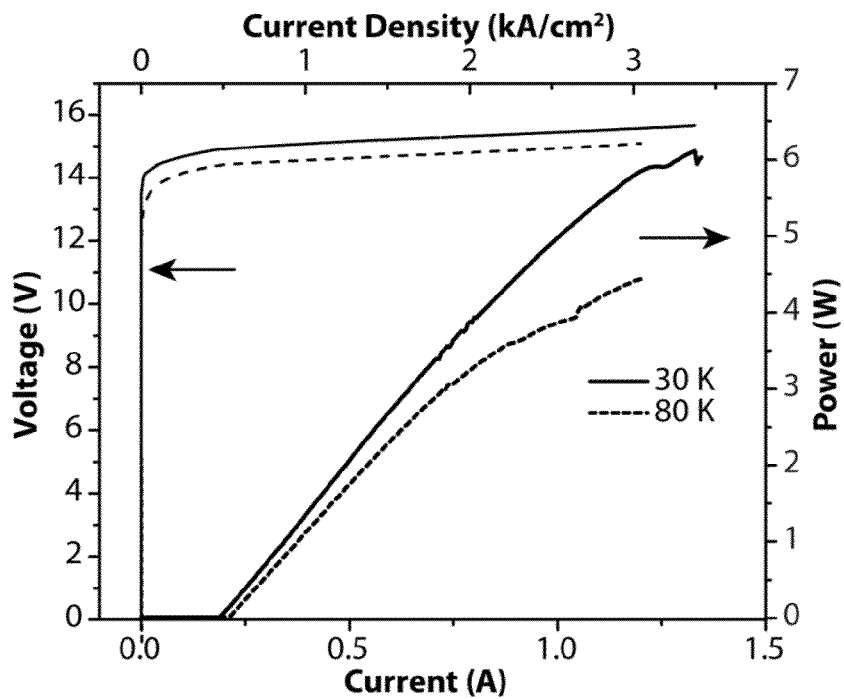
FIGS. 6A, 6B illustrate continuous-wave light-current-voltage measurements and extracted WPE, with FIG. 6A showing continuous-wave light-current-voltage measurement for the same laser as shown in FIGS. 4A, 4B at heat sink temperatures of 30 K and 80 K where the measured single-facet optical power is doubled for two facets and corrected for optical collection efficiency, and FIG. 6B showing the CW WPE versus current extracted from the experimental results in FIG. 6A.
Figure 6B:
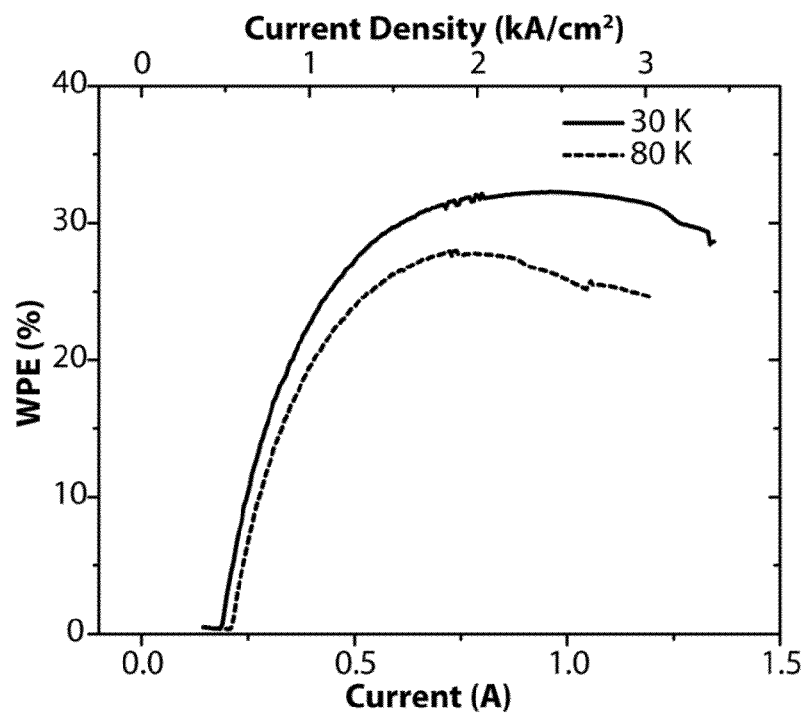

The lasers were also characterized in continuous-wave (CW) mode operation at cryogenic temperatures. The laser shown in FIGS. 4A, 4B had a peak CW power of at least 6.0 W and 4.5 W at 30 K and 80 K, respectively, FIG. 6A. Maximum values for the CW WPE of 32% at 30 K and 28% at 80 K were extracted, FIG. 6B. They were significantly lower, however, than the corresponding pulsed results at the same temperatures. This was largely due to lack of an efficient heat removal mechanism as these lasers were not fabricated and packaged for CW operation.

Example 2

Exemplary QC laser structures according to the design of FIG. 7 were grown by metal organic chemical vapour deposition (MOCVD) on InP substrate using strain-balanced In$_{0.652}$Ga$_{0.348}$As/Al$_{0.690}$In$_{0.310}$As and consisted of a low-loss InP-based waveguide surrounding 41 repeats of the injector—active region sequence. The injector had a sheet doping density of 1×10$^{11}$ cm$^{-2}$. Electroluminescence (EL) structures were fabricated as deep-etched, 200 μm diameter mesas with Ti/Au (250/2500 Å) top and Ge/Au (250/2500 Å) bottom contacts. The mesas were mounted to a copper heat sink. The lasers were fabricated as deep-etched ridge waveguide lasers with ridge width of around 10 μm and SiO$_2$ (3300 Å) for side-wall electrical insulation. The devices were thinned to ~200 μm and top Ti/Au (230/2500 Å) and bottom Ge/Au (230/2500 Å) contacts were deposited. The ridges were cleaved to various lengths and mounted epitaxial side up to copper heat sinks.

Figure 8A:
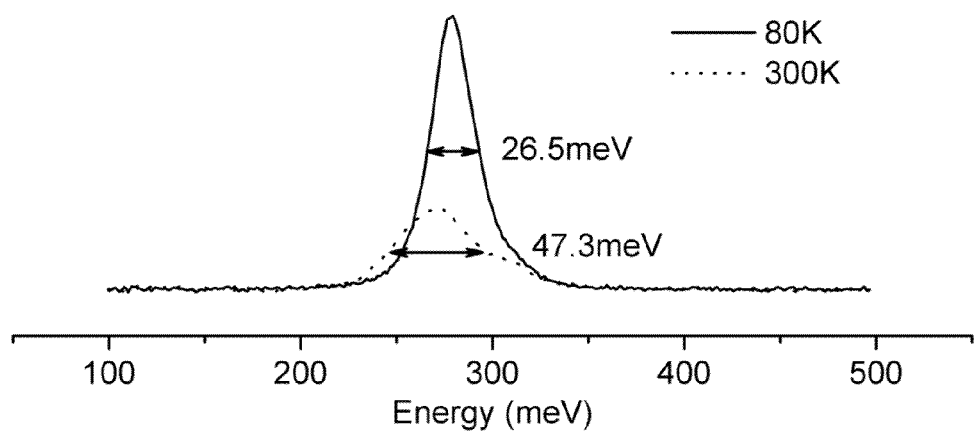
FIG. 8A illustrates electroluminescence spectra of a mesa at 80K and 300K for a pumping current of 0.75 A for the QC laser design of FIG. 7, showing a single transition centered at 279 meV with a full width at half minimum of 26.5 meV at 80 K.
Figure 8B:
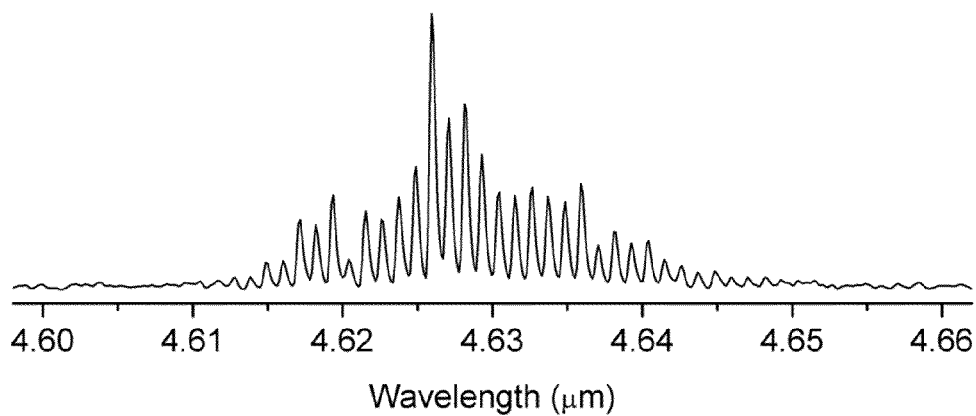
FIG. 8B illustrates a laser spectrum close to threshold at 80 K for the QC laser design of FIG. 7.
Figure 9A:
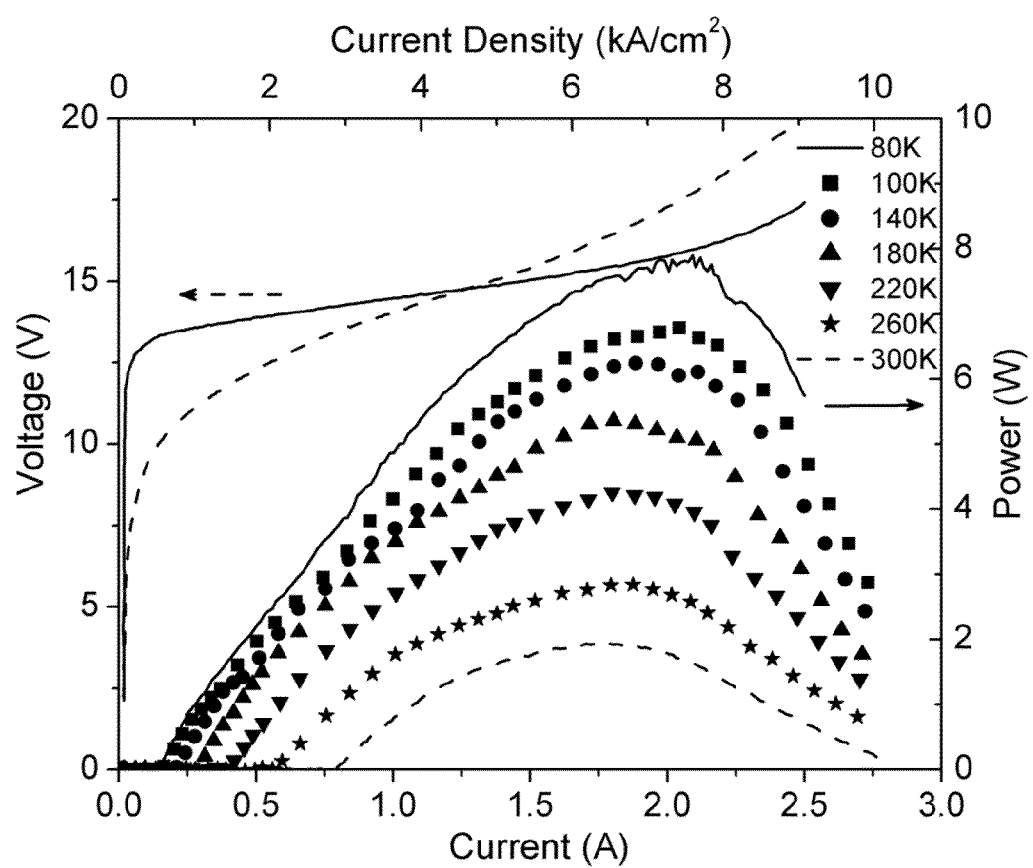
FIG. 9A illustrates pulsed light-current-voltage measurements for a 9.5 μm wide, 2.9 mm long laser at different heat sink temperatures (light is from two facets), with current-voltage curves for 80 K and 300 K.
Figure 9B:
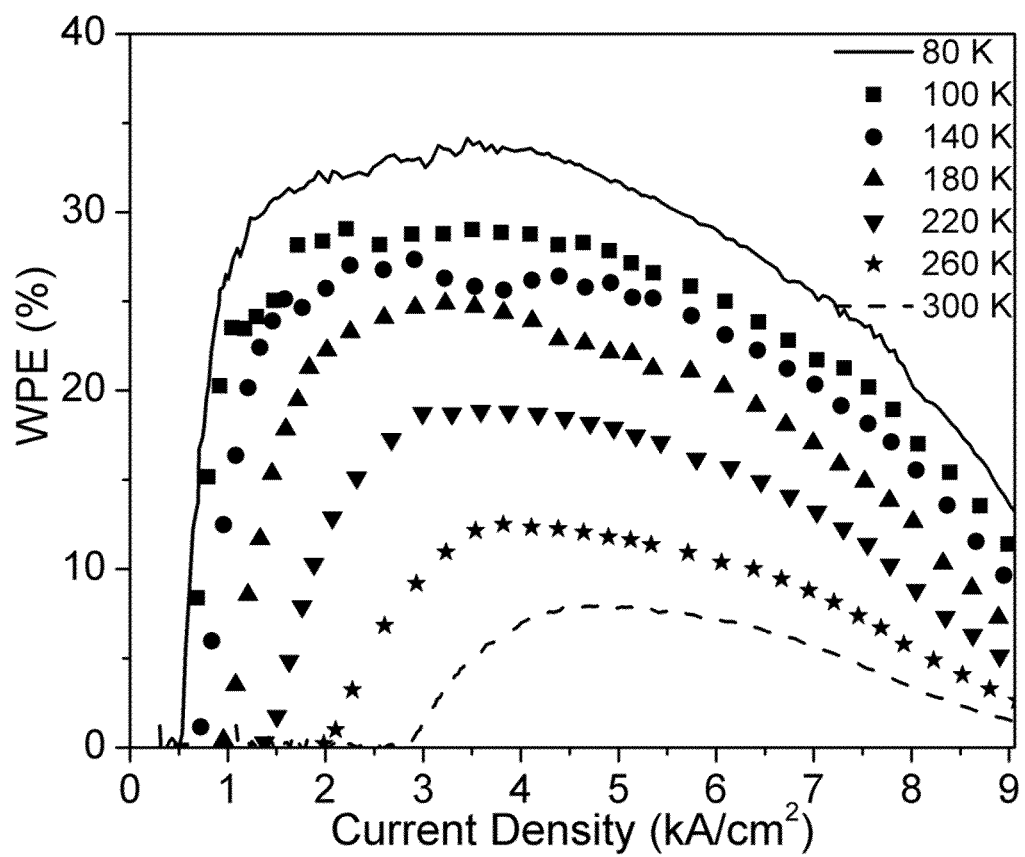
FIG. 9B illustrates pulsed wall-plug efficiency versus current density at different heat sink temperatures for the laser of FIG. 9A, showing a peak WPE of 34% at 80K and 8% at 300K.
Figure 9C:
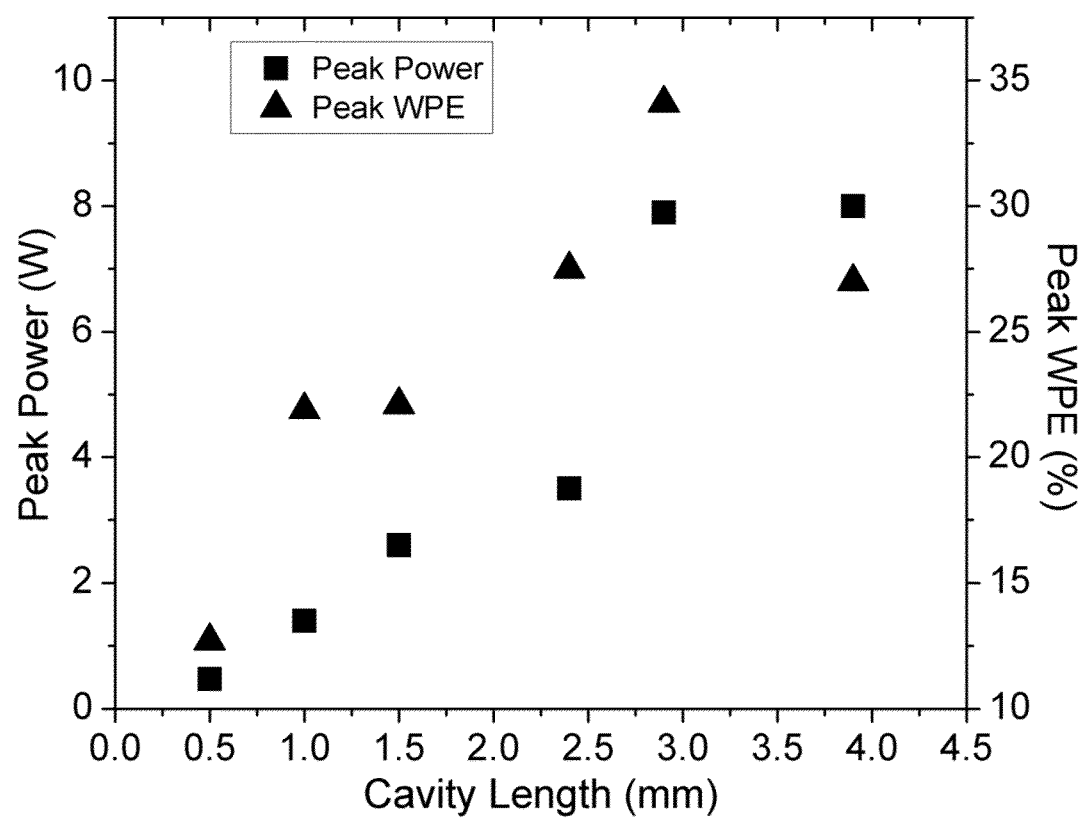
FIG. 9C illustrates pulsed, peak power and wall-plug efficiency (from two as-cleaved facets) for the best tested devices of different cavity lengths.

Electroluminescence spectra were collected for various pumping currents at heat sink temperatures of 80K and 300K, FIG. 8A; the full width at half maximum (FWHM) values were 26.5 meV at 80K and 47.3 meV at 300K, respectively. Pulsed light-current-voltage (LIV) measurements were performed on many lasers at several heat sink temperatures. FIG. 8B shows the spectrum of an as-cleaved 9.5 μm wide×2.9 mm long laser; the lasing wavelength was around 4.63 μm. FIG. 9A shows the LIV data at several different temperatures for this laser. At 80K the laser had a threshold current density of 0.44 kA/cm$^2$ and produced a double-facet peak power of 8.0 W; at 300K its threshold current density was 2.79 kA/cm$^2$, and it produced a double-facet peak power of 2.0 W. FIG. 9B shows the corresponding double-facet wall-plug efficiency (WPE) versus current density. At 80K and 300K the peak WPE reached 34% and 8%, respectively. Laser performances were also characterized as a function of cavity length. FIG. 9C shows the pulsed peak power and peak WPE versus cavity length for several devices. The as-cleaved 9.5 μm×2.9 mm laser had the best performance in terms of WPE.

The decrease in WPE for shorter lasers was due to the increase of the threshold current density as a result of larger mirror losses; for longer lasers the reduction in the extraction efficiency, as the waveguide loss became dominant, eventually decreased the WPE, though the optimal cavity length is not clear yet. A waveguide loss of 2.5 cm$^{-1}$ was extracted from length-dependent threshold current density data.

Continuum-to-Bound Broadband QC Laser

Figure 10:
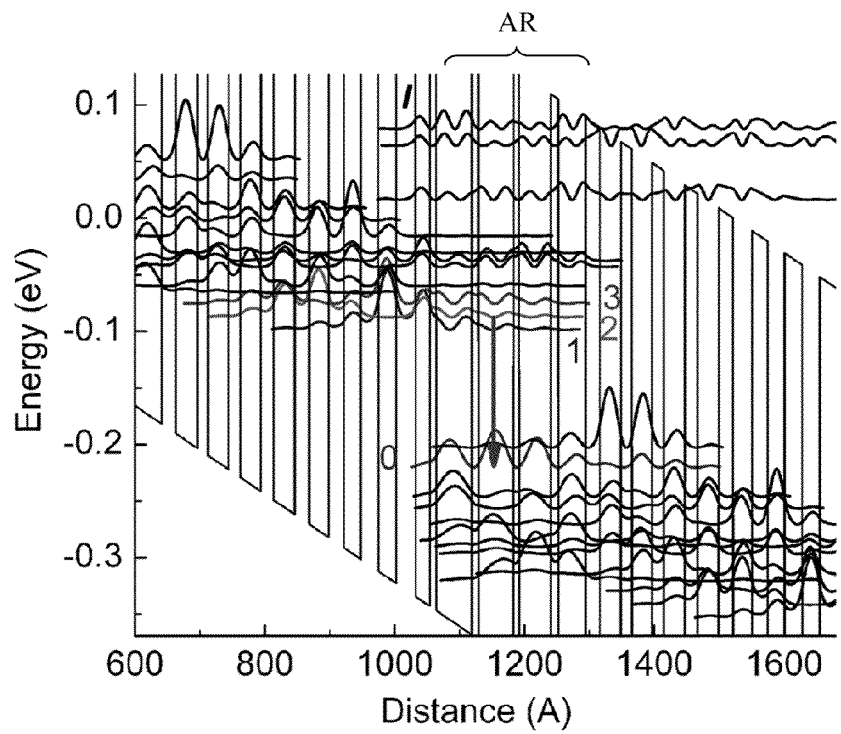
FIG. 10 illustrates a conduction band diagram of a portion of the active regions and injectors and the moduli squared of the relevant wave functions of an exemplary 'continuum-to-bound' QC laser design (design "A") under an electric field of 39 kV/cm where the designed emission wavelength is around 9.1 μm at T=295 K, and where the layer sequence of one period (starting from the extraction barrier, in angstrom) is 22/33/16/32/18/32/20/32/22/30/24/26/27/27/30/22/10/55/10/54/9/49/11/42, where In$_{0.52}$Al$_{0.48}$As barrier layers are in bold, In$_{0.53}$Ga$_{0.47}$As well layers are in normal font and the underlined layers are doped (Si, 1×10$^{17}$ cm$^{-3}$) and the laser transition is indicated by the arrow.
Figure 15:
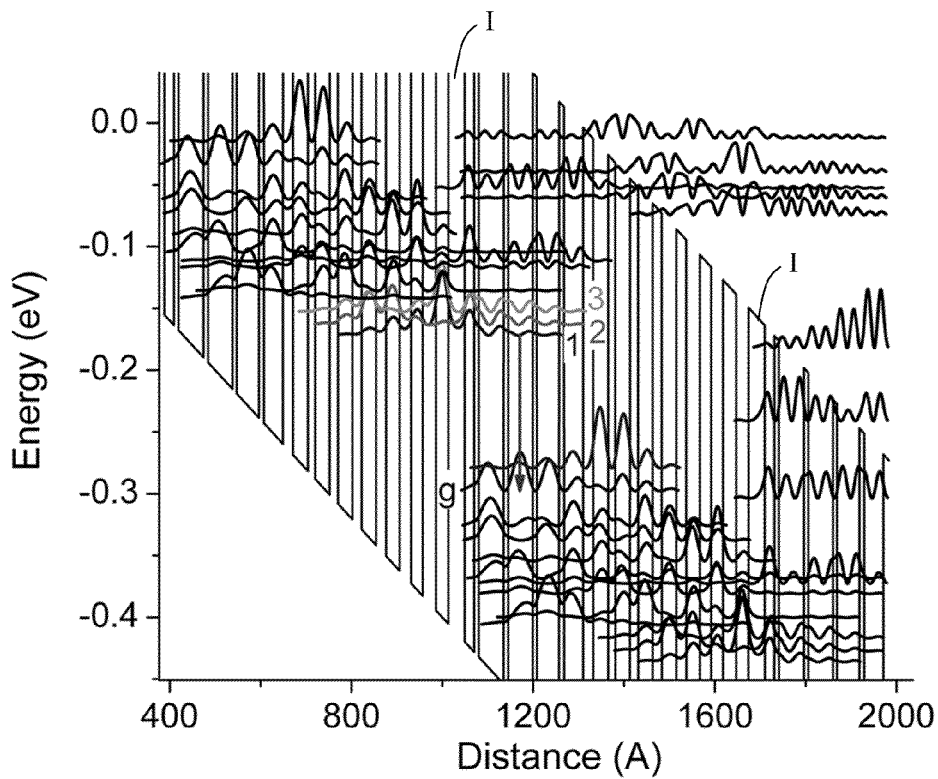
FIG. 15 illustrates a conduction band diagram of another exemplary "continuum-to-bound" QC laser design (design "B") under an applied electric field of 45 kV/cm, where the moduli squared of the relevant wave functions are plotted and the arrow indicates the laser transition, and where the layer thicknesses of one period of active region and injector are (in nanometers starting from the injection barrier) 3.6/2.1/1.0/5.5/1.0/5.4/0.9/4.9/1.1/4.2/2.2/3.3/1.6/3.2/1.8/3.2/2.0/3.2/2.2/3.0/2.5/2.6/2.9/2.7, where InAlAs barriers are in bold, InGaAs wells are in normal font, and Si-doped (1×10$^{17}$ cm$^{-3}$) layers are underlined.

In another of its aspects, the present invention may provide a broadband QC laser gain medium based on a "continuum-to-bound" active region design. Two exemplary QC laser designs (designs A and B) having "continuum-to-bound" active regions, but with different coupling strengths, are presented first. FIG. 10 shows the band diagram of design A. States 1, 2 and 3 are strongly coupled, spanning across the injectors and the active region with an energy splitting of ~23 meV between state 1 and state 3. In design B, the energy splitting between state 1 and state 3 is ~18 meV, FIG. 15. The energy splitting affects the profile of the gain spectrum. Ultra-strong coupling between the injector states and the upper laser state improves electron injection efficiency and reduces the transit time from injectors to the active region, therefore, compensating in part for the reduction of the peak gain resulting from the spectral broadening. The resulting spectral broadening does not affect the laser performance in terms of output power and efficiency, etc. The reason is that once laser action is established from one of the upper laser states, all electrons from the other two states will refill this state because its lifetime is dramatically decreased by the photon-driven transport; therefore, most of the electrons on these three states will still contribute to the stimulated emission. The injectors and injection barrier, I, were carefully designed so that the carrier leakage through the active region into the continuum above the quantum wells was minimized. A four-well active region, AR, is used for its large oscillator strength and low carrier backfilling probability. The designed emission wavelength is around 9.1 μm at T=295 K. The layer sequence for design A for one period (starting from the extraction barrier, in angstrom) is 22/33/16/32/18/32/20/32/22/30/24/26/27/27/30/22/10/55/10/54/9/49/11/42, where In$_{0.52}$Al$_{0.48}$As barrier layers are in bold, In$_{0.53}$Ga$_{0.47}$As well layers are in normal font and the underlined layers are doped (Si, $1\times10^{17}$ cm$^{-3}$). The laser transition is indicated by the arrow. The layer sequence for design B for one period of active region and injector are (in nanometers starting from the injection barrier, I) 3.6/2.1/1.0/5.5/1.0/5.4/0.9/4.9/1.1/4.2/2.2/3.3/1.6/3.2/1.8/3.2/2.0/3.2/2.2/3.0/2.5/2.6/2.9/2.7, where InAlAs barriers are in bold, InGaAs wells are in normal font, and Si-doped ($1\times10^{17}$ cm$^{-3}$) layers are underlined.

The calculation of the electroluminescence (EL) lineshape was carried out in a similar way to A. Wittmann, et al., IEEE J. Quantum Electron 44, 1083-1088 (2008). The spontaneous emission of an individual transition from state i (i=1, 2, 3) to the lower laser state $0$ is proportional to the oscillator strengths $f_{i0}=2m_0 E_{i0} z_{i0}^2/\hbar^2$ multiplied by the Lorentzian lineshape function $L(E-E_{i0})=\gamma_{i0}/\pi((E-E_{i0})^2+\gamma_{i0}^2)$ where $2\gamma_{i0}$ is the full width at half maximum (FWHM) of a single transition. The FWHM is dominated by the broadening due to the interface roughness ($2\gamma_R$); however, the LO phonon scattering mechanism ($2\gamma_{LO}=\hbar/\tau_{LO}$) should also be taken into consideration. The former can be calculated following A. Wittmann, et al., Appl. Phys. Lett. 93, 141103 (2008).

$$2\gamma_R = (\pi m^*/\hbar^2)\Delta^2\Lambda^2\delta U^2 \Sigma_k [\psi_i^2(z_k) - \psi_g^2(z_k)]^2 \quad (1)$$

Figure 11:
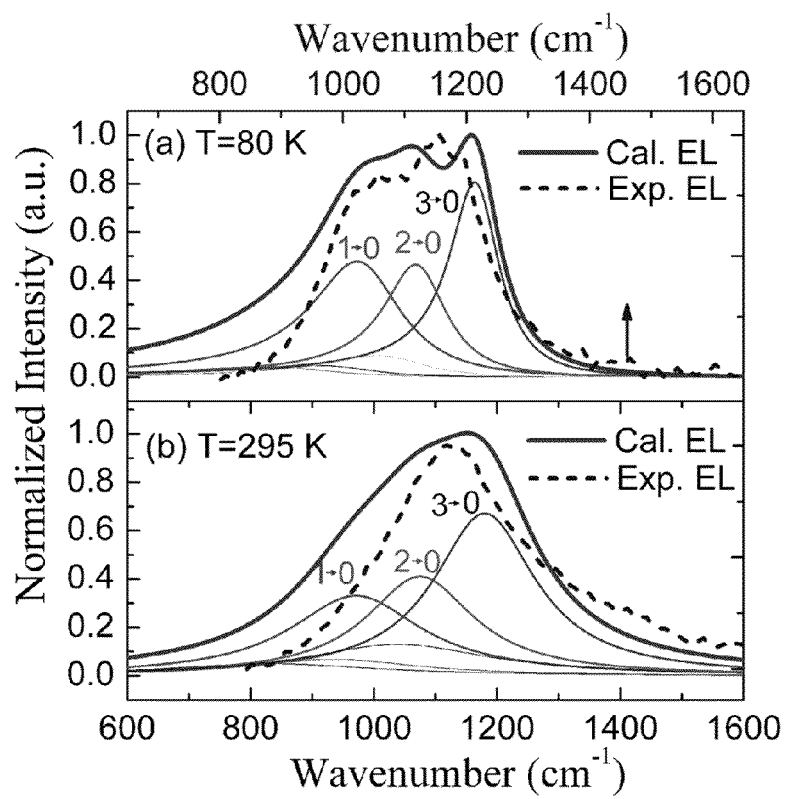
FIG. 11 illustrates calculated (solid line) and experimental (dashed line) electroluminescence (normalized) at an applied electric field of 39 kV/cm at 80 K, panel (a), and 295 K, panel (b), for the design of FIG. 10, where the x-axes in panel (a) are offset by 50 cm$^{-1}$ to overlay the calculated and experimental electro-luminescence lineshapes for better comparison.
Figure 16:
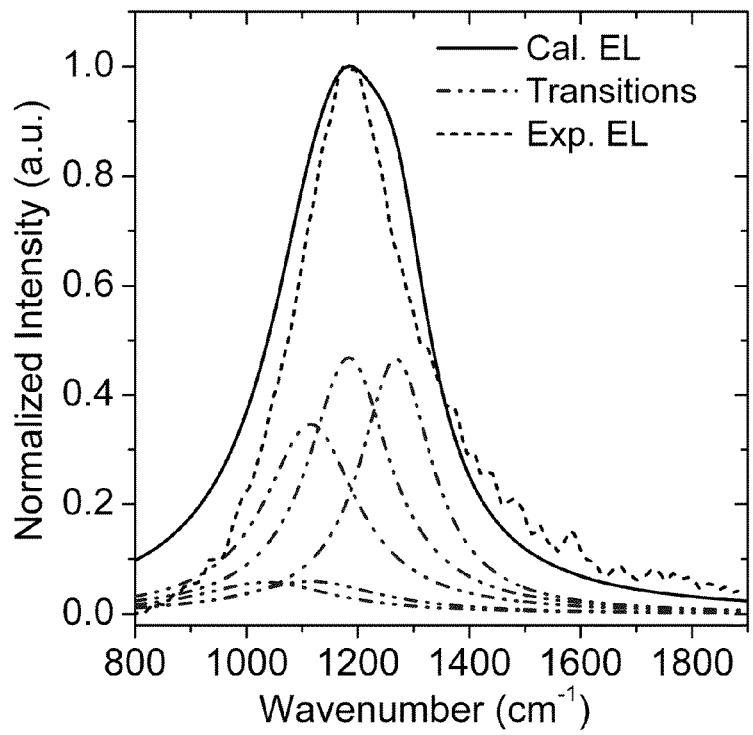
FIG. 16 illustrates calculated (solid line) and experimental (dashed line) electroluminescence (EL) (normalized) for the exemplary design of FIG. 15.

The average roughness height $\Delta$ and a correlation length $\Lambda$ depend on the growth conditions. For our samples, we measured the EL at an electrical field high above the resonant field, where all three states are already decoupled and thus a single transition dominates the gain spectrum. The FWHM of this transition was obtained and the interface parameter product $\Delta\Lambda=1.02$ nm$^2$ was then extrapolated from Eq. (1). At a certain applied field, the FWHM of each transition can be calculated using the extrapolated roughness factor and calculated LO phonon scattering lifetime. The electron population on each upper laser state should be used as a weighing factor for the corresponding transition when calculating the gain spectrum lineshape. It is a balance of competition between phonon-assisted relaxation and resonant tunnelling among the three upper states and others. We assume equal electron distributions on all three upper laser states, because the resonant tunnelling among the three states dominates in the carrier redistribution. FIG. 11 shows the calculated lineshape of individual transitions and EL of design A at electric fields above the laser threshold. A FWHM of 300 cm$^{-1}$ and 350 cm$^{-1}$ is expected for EL at 80 K and 295 K, respectively. For design B, FIG. 16 shows the EL spectra as the sum of all transitions leading to a broader spectral width than that of a single transition.

EXAMPLES

Exemplary prototype devices based on designs A and B (with the continuum-to-bound active regions) were grown by solid source molecular beam epitaxy (MBE) with InGaAs/InAlAs quantum wells lattice-matched to an InP low-doped substrate (doped n~1-2×10$^{17}$ cm$^{-3}$). The active core included 40 periods of injector and active regions. A 0.6 μm InGaAs (doped n~5×10$^{16}$ cm$^{-3}$) layer was grown below the active region for mode confinement; a 0.3 μm InGaAs (doped n~5×10$^{16}$ cm$^{-3}$) top mode confinement layer and a 2.8 μm AlInAs (doped n~1×10$^{17}$ cm$^{-3}$) top cladding layer were grown above the active core, followed by a 0.6 μm InGaAs plasmon layer (doped n~1×10$^{19}$ cm$^{-3}$) and a final 300 Å thick layer of InGaAs (doped n~2×10$^{19}$ cm$^{-3}$) as the contact layer. The wafer was processed into 200 μm diameter circular mesas as well as deep-etched ridge lasers with different ridge widths (from 11 to 20 μm).

Figure 12A:
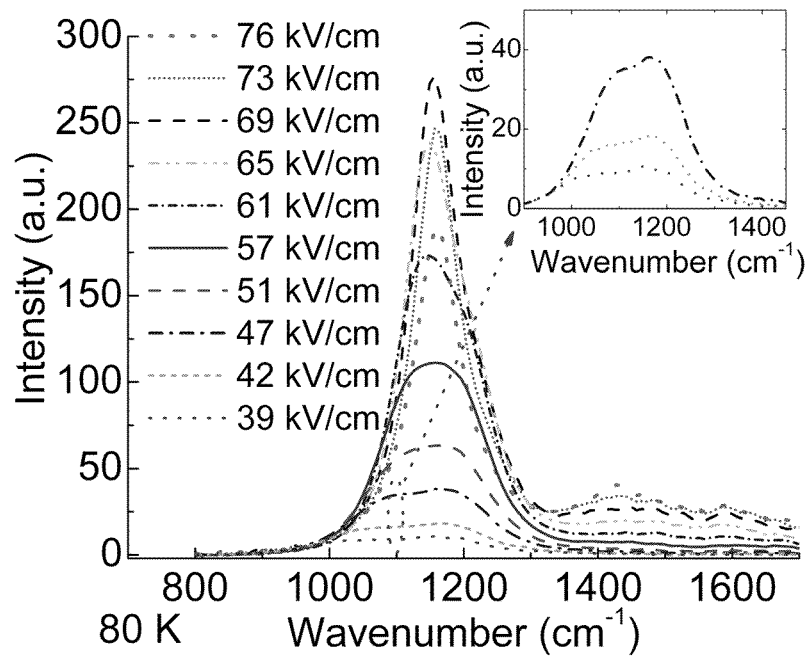
FIGS. 12A, 12B illustrate electroluminescence spectra at 80 K and 295 K, respectively, for the design of FIG. 10 at various applied electrical fields as indicated.
Figure 12B:
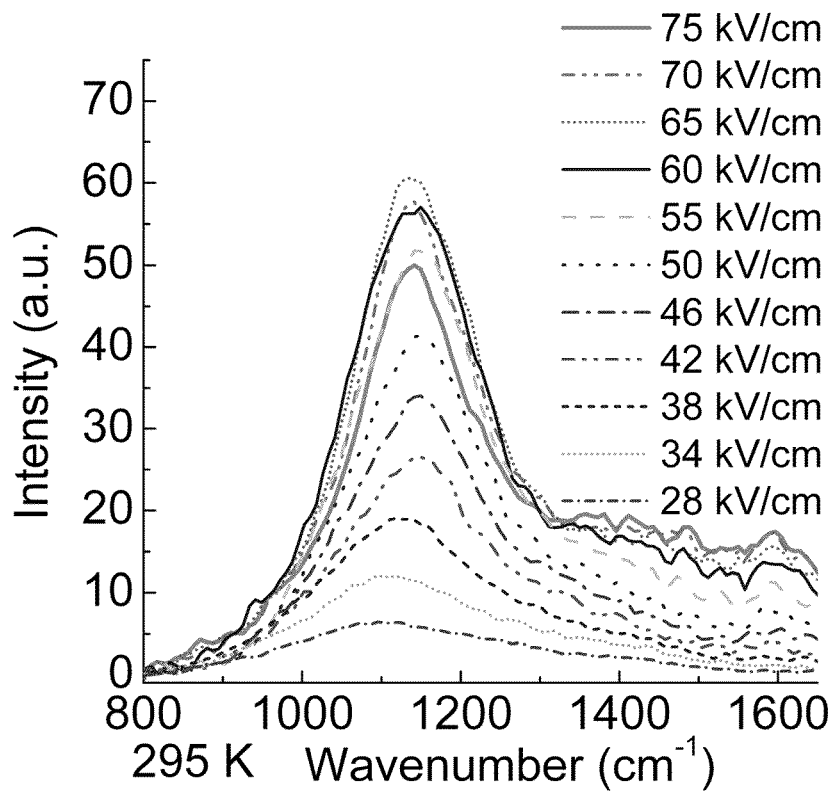

Electroluminescence from a semi-circular cleaved mesa based on design A (~23 meV splitting) was measured at 80 K and at room temperature (~295K) in pulsed mode at different applied electrical fields, as shown in FIG. 12A, 12B, respectively. Electroluminescence at 80K showed a flat top over a large applied electrical field range (from below 39 kV/cm to 47 kV/cm). This flat top indicated not only multiple transitions but also an electron distribution that was far different from the thermal distribution. If the three upper laser states were thermally populated, the electron population on the lowest upper laser state $1$ would be 16 times more than that on state $3$ and 4 times more than that on state $2$; with such a thermal population and given the individual oscillator strengths, the EL lineshape would not display a flat top. Conversely, assuming equal population of all three states due to their strong coupling, the calculated EL closely resembled the experimental data, as shown in FIG. 11($a$). The EL at 295 K did not show a flat top, due to a broader linewidth of individual transitions, as shown in FIG. 11($b$). In design B, the EL was measured at 295 K and did not show a flat top at any temperature, because the energy splitting between upper laser states was smaller, FIG. 16.

Figure 13:
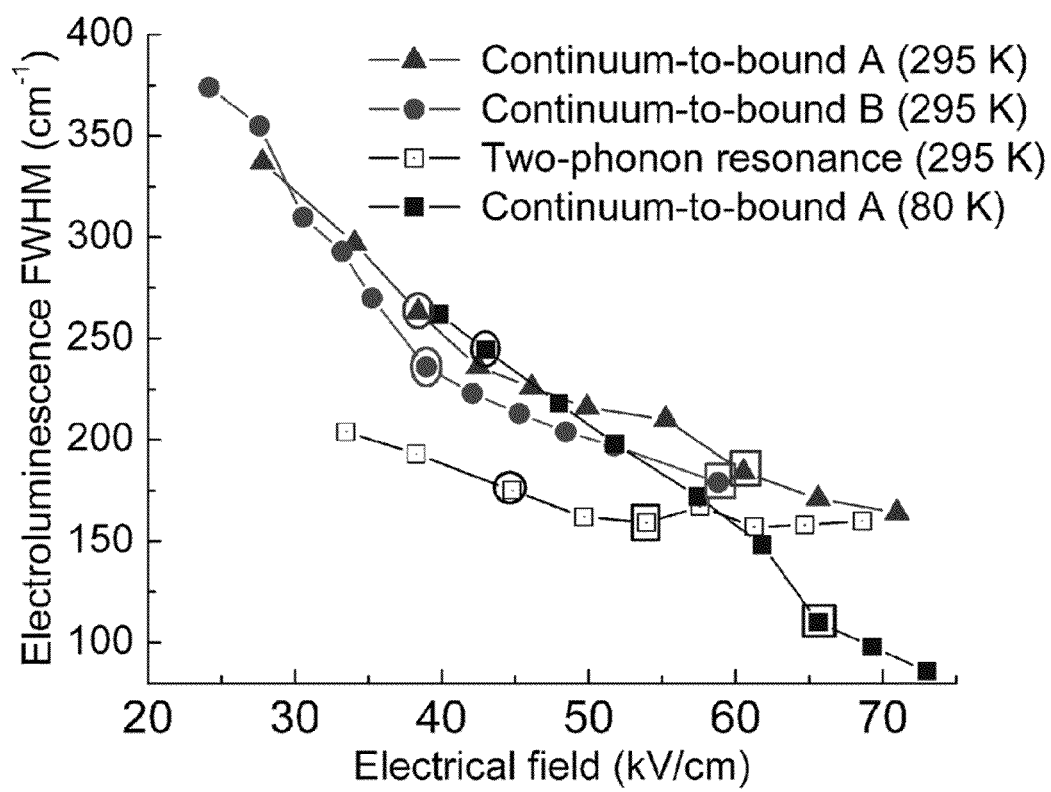
FIG. 13 illustrates measured electroluminescence full width at half maximum (FWHM) of the continuum-to-bound design A (295 K: triangles, 80 K: solid squares), design B (circles), and a conventional two-phonon resonance design (squares with dots), where the open circles indicate the laser threshold and the open squares indicate the power rollover.

The EL FWHM was extracted from the experimental results and is plotted in FIG. 13. Design A had a wider EL width than design B, due to the larger energy splitting among the three upper laser states. The energy splitting and the number of upper laser states can be increased further to achieve an even broader EL width. But there is a trade-off between a wide EL and a high peak gain coefficient. Therefore, an optimum coupling strength should exist to provide enough gain as well as required gain spectrum width. Also shown on FIG. 13 is the EL FWHM at 295 K from a two-phonon design at a similar emission wavelength grown by the same MBE reactor. See, Z. Liu, et al., IEEE Photon. Tech. Lett. 18, 1347-1349 (2006) for the two-phonon design. The EL FWHM of the continuum-to-bound design was significantly broader than that of the two-phonon design over a large applied field range. Only at very high electrical fields did the EL narrow as a result of an unbalanced oscillator strength distribution over the three states where they start to decouple from each other. The transitions finally narrow down to that of a single transition when the lowest injector state is elevated high above the upper laser state.

The ridge lasers showed comparable slope efficiency (>1 W/A) as well as temperature performance (T$_0$≥170 K) to the best QC lasers reported at similar wavelengths. (Q. Wang, et al., Appl. Phys. Lett. 94, 011103 (2009)). The threshold current density was ~3 kA/cm$^2$ at room temperature for 3 mm long, 20 μm wide lasers with as-cleaved facets. (The maximum current density was 8 kA/cm$^2$ at roll-over.) Although design A had longer wavelength and a wider gain spectrum, a significant threshold difference was not found between designs A and B. The extracted modal gain coefficient at room temperature of ~10 kA/cm was comparable with the three-phonon design at a similar wavelength reported recently (11.58 kA/cm). (Ibid.) But the waveguide loss (~20.0 cm$^{-1}$, obtained by comparing the laser thresholds before and after high reflectivity (HR) coating) was much higher than 8.8 cm$^{-1}$ as reported, which explained in part the higher threshold current density. We believe a lower doping density and low-doped InP cladding, instead of AlInAs cladding, would reduce the threshold current density and further improve the efficiency and temperature performance.

Figure 14A:
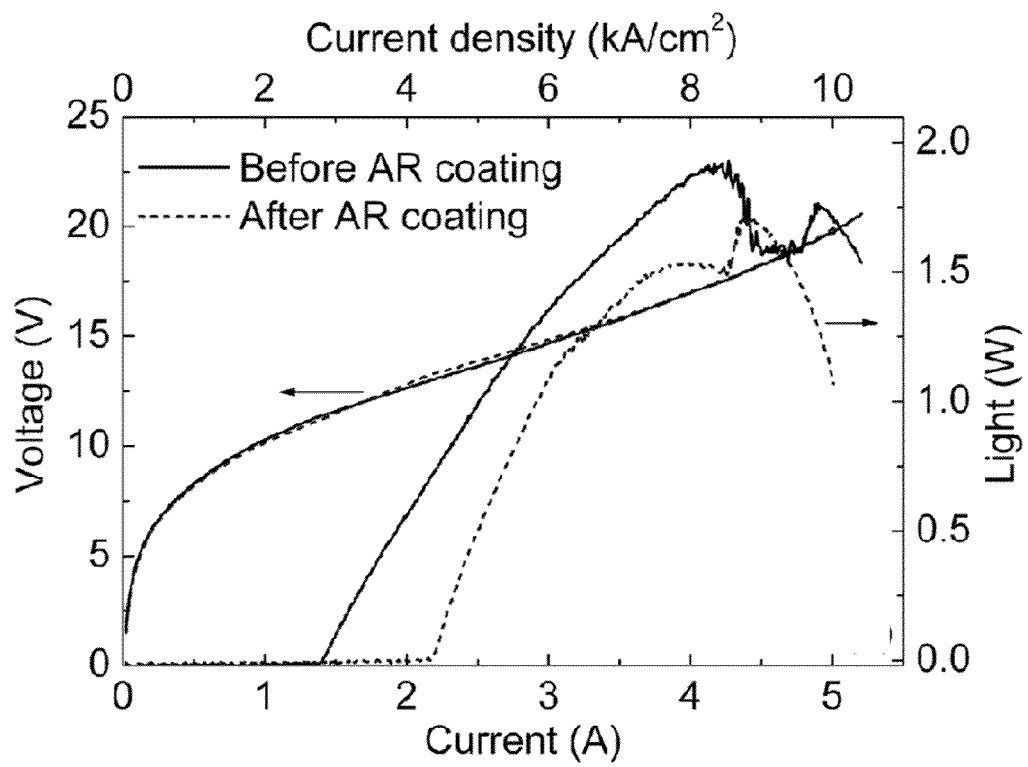
FIG. 14A illustrates light-current-voltage characteristics of the QC laser of FIG. 15 before and after AR coating at room temperature (T=295 K) in pulsed mode.
Figure 14B:
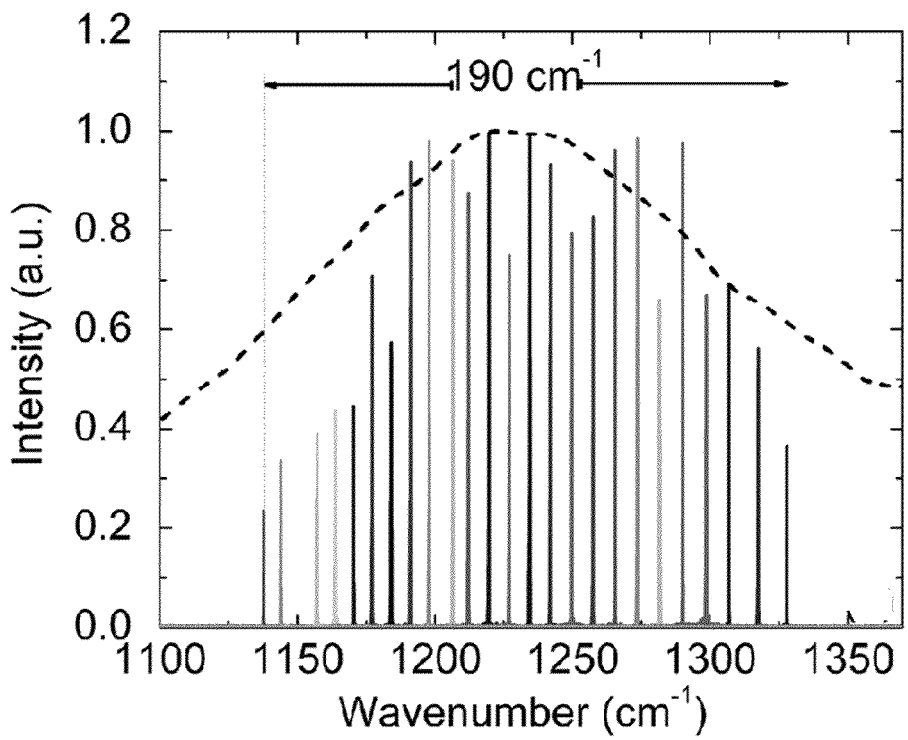
FIG. 14B illustrates tuning of the external cavity laser and EL (dashed line) at a current density of 4 kA/cm$^2$ at 0° C. in pulsed mode.

FIG. 14A shows the light-current-voltage characteristics of a thin-gold ridge laser based on design B at room temperature (~295 K). The laser cavity was 3 mm long, 18 µm wide and high reflectivity (HR) coated on the back facet. Its threshold current densities were ~2.55 kA/cm$^2$ and 4.06 kA/cm$^2$ before and after anti-reflection (AR) coating (estimated AR coating reflectivity is ~0.01%). A peak power of about 2 W at 295 K was measured from the front facet. This laser was used in our first external cavity implementation, which was not optimized for a maximum tuning range. The tuning range was over 170 cm$^{-1}$ at 20° C. and 190 cm$^{-1}$ at 0° C. in pulsed mode, as shown in FIG. 14B. The tuning range of lasers based on design A is estimated to be more than 220 cm$^{-1}$ from the EL spectrum.

Continuum-to-Continuum Broadband QC Laser Design

In addition to the broadband QC laser designs A and B presented above, a further exemplary broadband QC laser design is provided operating in the 4-5 µm wavelength region with even broader gain. The design has a gain spectral width of ~400 cm$^{-1}$, peak wall plug efficiency (WPE) of ~17% and slope efficiency of over 4.5 W/A at room temperature (T=295 K) in pulsed mode operation, showing that it is possible to produce a wide gain spectrum compatible with high output power and efficient performance.

Figure 17A:
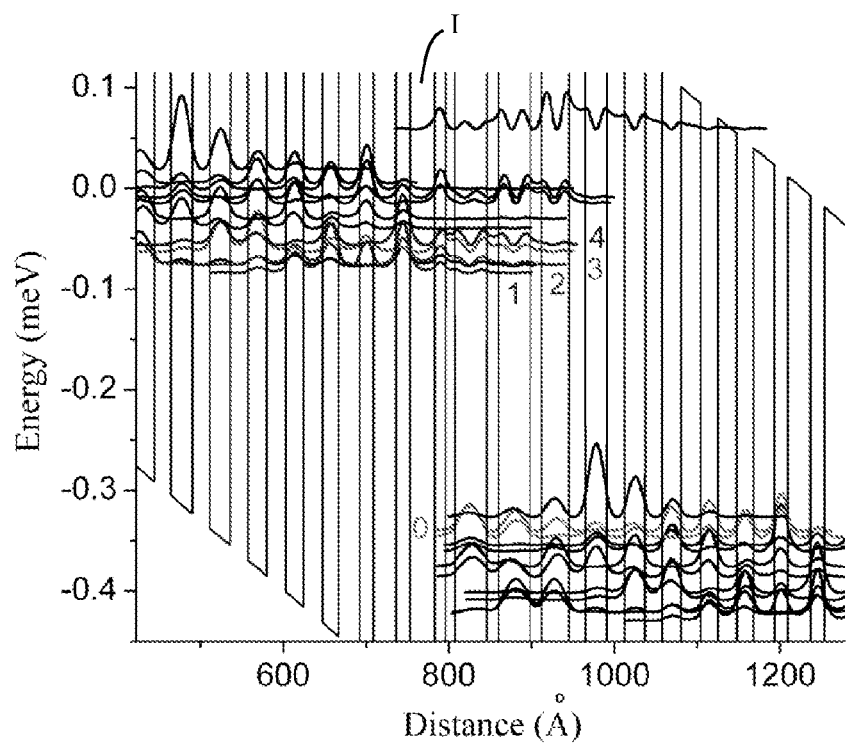
FIG. 17A illustrates a conduction band diagram of a portion of the active regions and injectors and the moduli squared of the relevant wave functions of an exemplary design of a continuum-to-continuum QC laser at an electric field of 69 kV/cm having a layer sequence of one period in the first design (starting from the extraction barrier, in angstrom) of 20/26/21/25/21/23/23/21/23/20/25/17/27/17/30/13/11/39/14/38/14/33, where In$_{0.342}$Al$_{0.658}$As barrier layers are in bold, In$_{0.673}$Ga$_{0.327}$As well layers are in normal font and the underlined layers are doped (Si, 2×10$^{17}$ cm$^{-3}$)
Figure 17B:
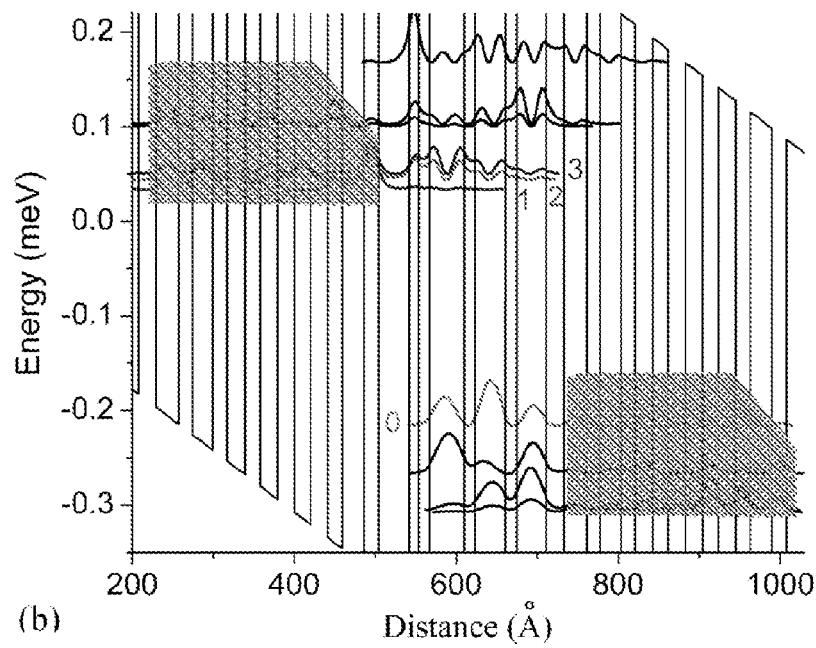
FIG. 17B illustrates a conventional high performance design at an electric field of 65 kV/cm$^2$.

FIG. 17A shows the band diagrams of the further exemplary broadband design. The layer thicknesses of one period of active region and injector are (in nanometers starting from the injection barrier, I) 3.6/2.1/1.0/5.5/1.0/5.4/0.9/4.9/1.1/4.2/2.2/3.3/1.6/3.2/1.8/3.2/2.0/3.2/2.2/3.0/2.5/2.6/2.9/2.7, where InAlAs barriers are in bold, InGaAs wells are in normal font, and Si-doped (1×10$^{17}$ cm$^3$) layers are underlined. FIG. 17B shows a conventional high performance laser design at an applied field of 69 kV/cm and 65 kV/cm, respectively, when the lowest state in the active region is just above the lowest injector state. In the broadband design of FIG. 17A, three injector states 2, 3, 4 are strongly coupled with the upper state 1 and spread into the active region, with an energy splitting of 26 meV between states 1 and 4. Transitions from all four states 1-4 contribute to the gain spectrum. However, in the conventional design, FIG. 17B, only one injector state is coupled with the upper laser state with an energy splitting of only 6 meV. The strong coupling of the design of FIG. 17A not only generates more transitions to expand the gain spectral width, but also increases the injection rate from injector states into the upper laser states. Therefore, a shorter transit time of electrons into the active region reduces the electron accumulation in front of the injection barrier so that the carrier leaking into the state above the upper laser states is minimized. To facilitate the carrier depopulation from the lower laser state, the design also includes strong coupling with the injector states so that the extraction rate is not limited by phonon scattering lifetime but further enhanced by resonant tunneling. This results in a QC laser design with multiple transitions from several upper laser states to a few lower laser states, a "continuum-to-continuum" design.

Example

An exemplary QC prototype according to the design of FIG. 17A was grown by metal organic chemical vapor deposition (MOCVD) on a low-doped InP substrate (doped n~1-2×10$^{17}$ cm$^3$). A 2 µm InP (doped n~3×10$^{16}$ cm$^3$) bottom cladding layer was grown before the growth of the active core to further reduce the wavelength loss. The active core included 40 periods of strain-compensated In$_{0.673}$Ga$_{0.327}$As/In$_{0.342}$Al$_{0.658}$As quantum wells and barriers. A 2 µm InP (doped n 3×10$^{16}$ cm$^{-3}$) top cladding layer was grown above the active core, followed by a 0.6 µm InP plasmon layer (doped n~8×10$^{18}$ cm$^{-3}$) and a final 100 nm thick layer of InGaAs (doped n~2×10$^{19}$ cm$^{-3}$) as the contact layer. The wafer was processed into 200 µm diameter circular mesas as well as deep-etched ridge lasers with Ti/Au 20 nm/300 nm as the top contact.

Figure 18:
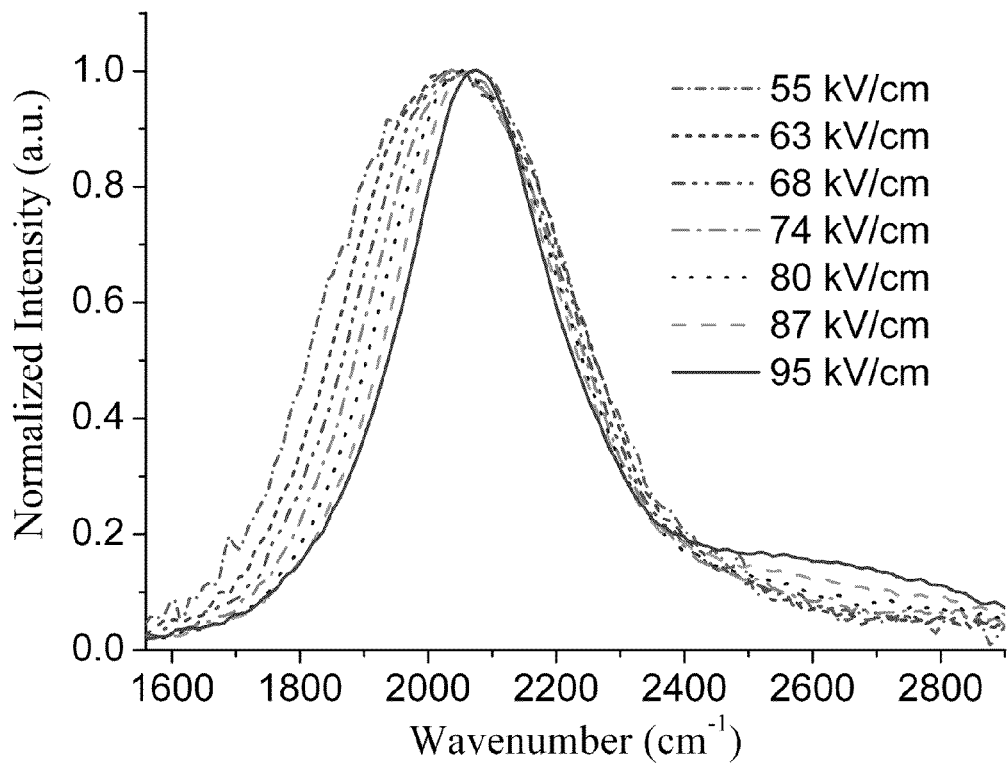
FIG. 18 illustrates the electroluminescence spectra of the design of FIG. 17A at T=295 K at various applied electrical fields as indicated.
Figure 19A:
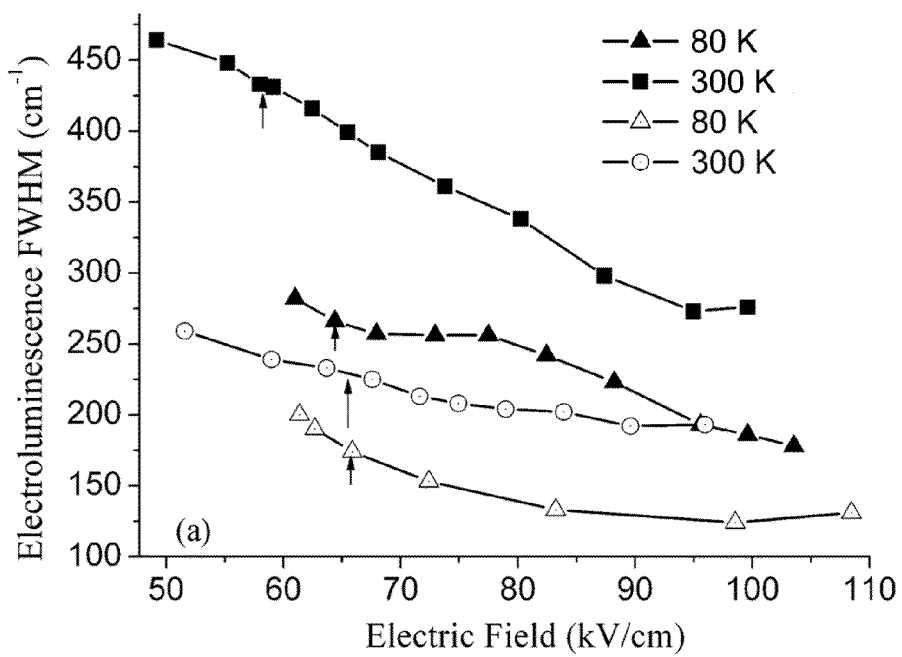
FIG. 19A illustrates measured electroluminescence full width at half maximum (FWHM) of the continuum-to-continuum design (design of FIG. 17A, 300 K: squares, 80 K: triangles) and a conventional high performance design (design of FIG. 17B, 300 K: open circles, 80 K: open triangles), where the arrows indicate laser thresholds.
Figure 19B:
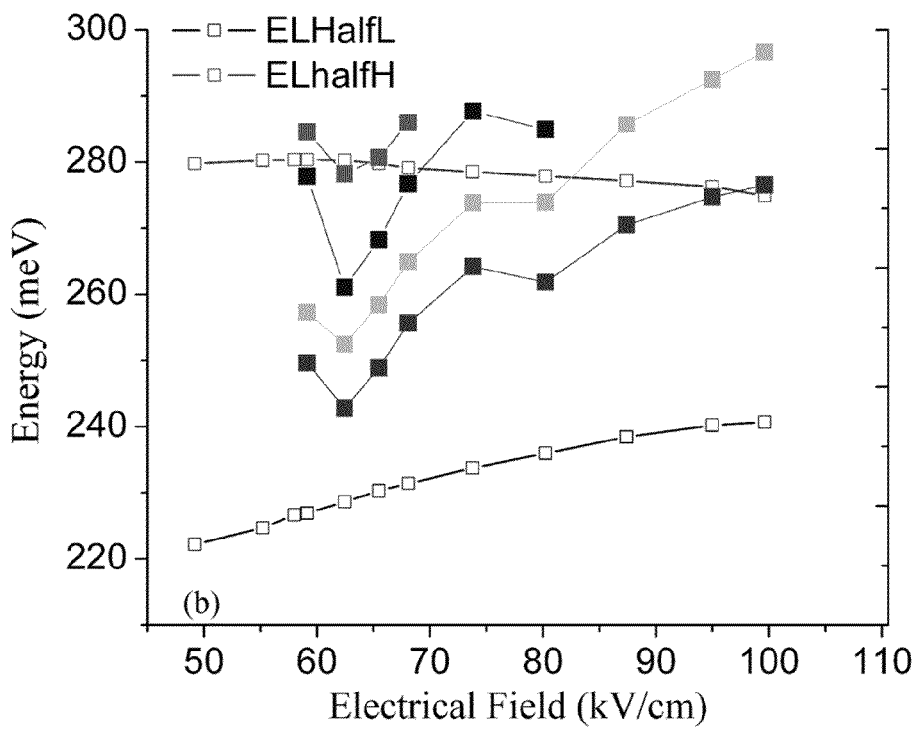
FIG. 19B illustrates calculated peak energies of dominant transitions (solid squares) and measured energies at EL half maxima (open squares) of the continuum-to-continuum design of FIG. 17A.

Electroluminescence (EL) from a semi-circular cleaved mesa was measured at room temperature (T=295 K) in pulsed mode at different applied electric fields, as shown in FIG. 18. Over the whole range, the EL showed a single dominating peak. The transition from the state (state 4) above the upper laser states did not appear until the electric field was increased to above 87 kV/cm, indicating a low current injection rate into that state. The EL full width at half maximum (FWHM) was extracted from the experimental data and plotted in FIG. 19A. The room temperature (295 K) EL FWHM was about 53 meV (~430 cm$^{-1}$) at laser threshold (59 kV/cm) and remained larger than 350 cm$^{-1}$ as the electrical field increased to 73 kV/cm, where the lasers reached the highest WPE. According to the band structure calculations, there were four or more major transitions contributing to the gain spectra when the electrical field was between 59 kV/cm and 72 KV/cm. As the applied field increased to 73 kV/cm, only the two lowest injector states were still coupled with the upper state. As the electrical field was further increased, three transitions dominated in the gain spectra until 80 kV/cm. The change of EL width matched well with the number of dominating transitions, as shown in FIG. 19B. As a comparison, the EL FWHM from the conventional laser design of FIG. 17B grown by the same MOCVD reactor on is included FIG. 19A. The broadband design of FIG. 17A evidenced almost twice as broad EL as that from the conventional design of FIG. 17B at room temperature (295 K).

Figure 20:
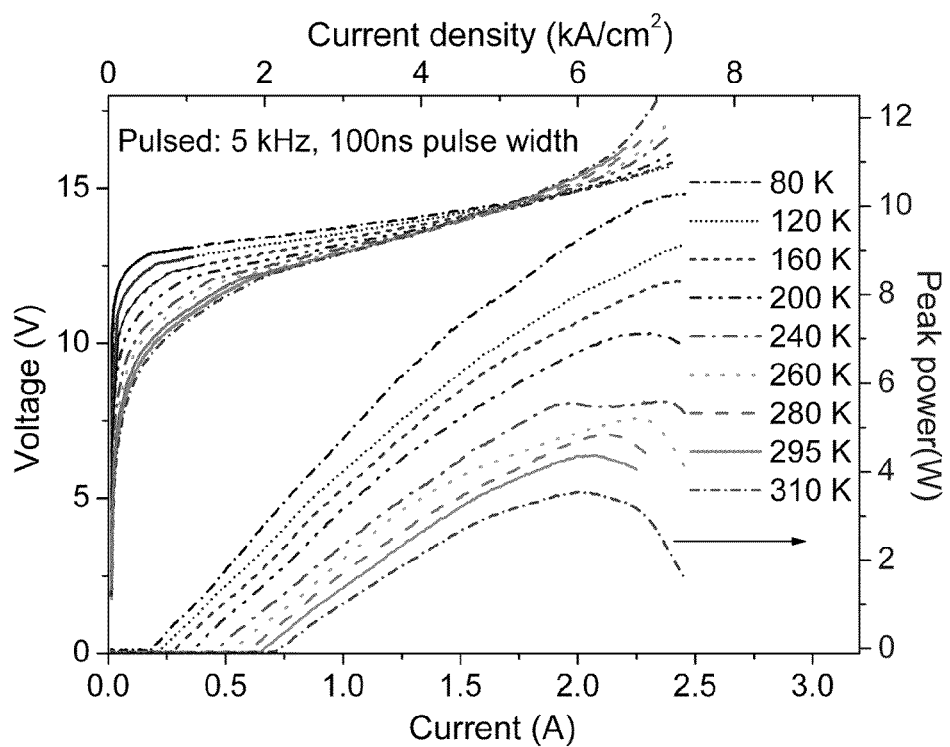
FIG. 20 illustrates light-current-voltage characteristics of a QC laser (11 μm wide, 3 mm long, total peak power from both as-cleaved facets) at different temperatures in pulsed mode.
Figure 21:
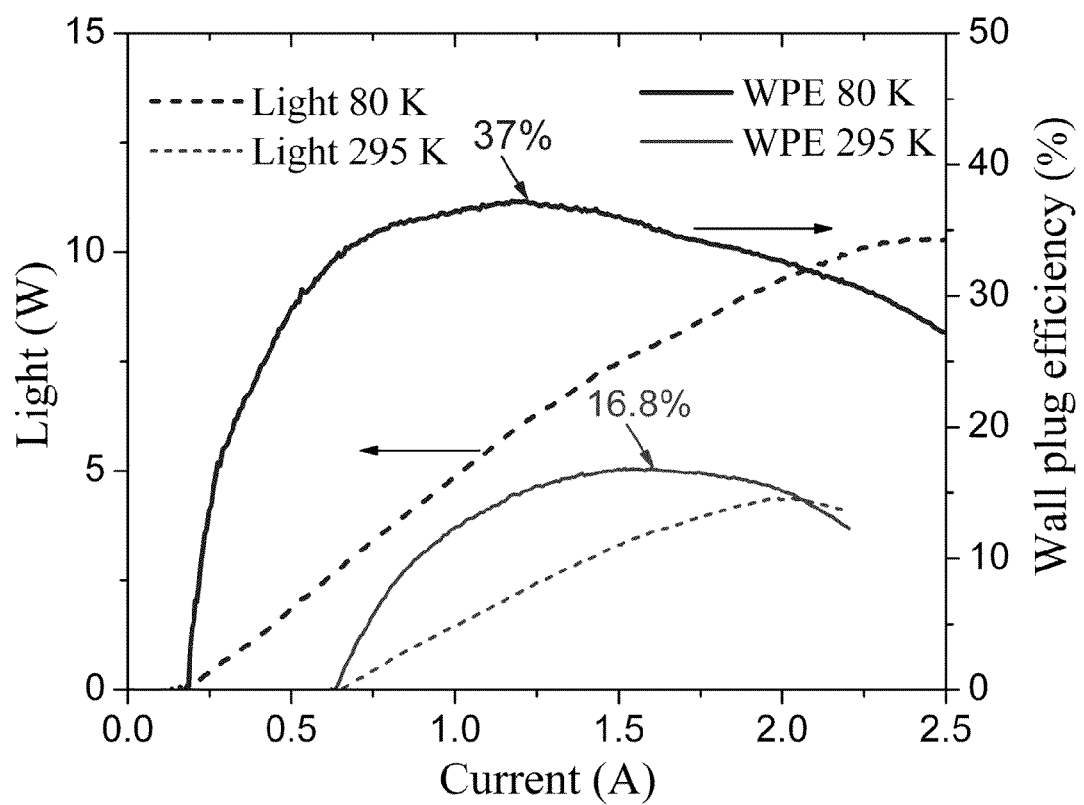
FIG. 21 illustrates wall plug efficiency (solid lines) and internal efficiency (short dashed lines) of the same laser as FIGS. 20 at 80 K and 295 K.

Ridge lasers (with ridge width between 7 to 13 µm) were processed with Ti/Au (20/300 nm) as the top contact. They were cleaved into 1 mm to 3 mm laser bars and mounted epi-side up onto the copper submounts. The pulsed light-current-voltage characteristics of a laser with a ridge width of ~11 µm, a cavity length of 3 mm and as-cleaved facets are shown in FIG. 20. The threshold current densities at 80K and 295 K were 0.54 kA/cm$^2$ and 1.8 kA/cm$^2$, respectively, with a characteristic temperature (T$_0$) of ~167 K. From lasers with wider ridge widths (~13 µm), the threshold current density at 295 K was below 1.6 kA/cm$^2$ due to the smaller waveguide loss. The slope efficiency was 6 W/A at 80 K and 4.5 W/A at 295 K. The total peak output power from both facets was more than 10 W at 80 K and still over 4 W at room temperature (T=295 K). FIG. 21 shows the WPE of this device as a function of injection current. The peak WPE was up to 17% at room temperature (295 K) and 37% at 80 K. Based on the measured light-current and voltage-current characteristics and waveguide loss, the internal efficiency was also calculated and is shown in FIG. 21. The prototype maintained an internal efficiency above 90% from threshold up to more than 8 times laser threshold current density at 80 K. At room temperature, an internal efficiency was still above 80% until twice the threshold current density. All this evidence indicated good electron transport and high electron injection efficiency into the upper laser states.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

Several publications and/or patent documents are referenced in this application, the disclosures of each of these publications and documents are incorporated by reference herein.

What is claimed is:

1. A quantum cascade source having ultra-strong coupling between injector and active regions, comprising:
a plurality of repeat units each including an active region and an injector region, the injector region having a plurality of barrier layers, the repeat units stacked in contact with one another linearly along a direction perpendicular to the layers, each injector region having an injection barrier having a thickness sufficiently thin and configured to cooperate with the respective neighboring active region and neighboring injector to provide a coupling strength of at least about 10 meV between the injector and active regions.

2. The quantum cascade source according to claim 1, wherein the thickness of the injection barrier has substantially the same thickness as the thickness of each of the plurality of barrier layers.

3. The quantum cascade source according to claim 1, wherein the thickness of the injection barrier has a thickness comparable to the thickness of each of the plurality of barrier layers.

4. The quantum cascade source according to any one of claims 1-3, wherein the injection barrier has a thickness sufficiently thin to provide a coupling strength of at least about 20 meV between the injector and active regions.

5. The quantum cascade source according to claim 4, wherein the quantum cascade source is a quantum cascade laser.

6. The quantum cascade source according to any one of claims 1-3, wherein the quantum cascade source comprises a quantum cascade laser comprising a plurality of lower injector states and an upper laser state, where the coupling strength between each lower injector state and the upper laser state is at least about 10 meV.

7. The quantum cascade source according to claim 6, wherein the quantum cascade laser has a gain spectrum width of about 250 cm$^{-1}$ full width at half maximum.

8. The quantum cascade source according to claim 6, comprising a plurality of upper laser states and a plurality of lower laser states to provide a plurality of lasing transitions therebetween.

9. The quantum cascade source according to claim 8, wherein the quantum cascade laser has a gain spectrum width of about 400 cm$^{-1}$ full width at half maximum.

10. The quantum cascade source according to any one of claims 1-3, wherein the quantum cascade source comprises a quantum cascade laser comprising a plurality of injector states and an upper laser state, where the coupling strength between each lower injector state and the upper laser state is at least about 20 meV.

11. The quantum cascade source according to any one of claims 1-3, wherein the quantum cascade source is a quantum cascade laser.

12. A quantum cascade laser having ultra-strong coupling between injector and active regions, comprising:
a plurality of repeat units each including an active region and an injector region, the injector region having a plurality of barrier layers, the repeat units stacked in contact with one another along an axis from a first end to a second end of the quantum cascade laser, each injector region having an injection barrier having a thickness comparable to that of each of the plurality of barrier layers to provide the ultra-strong coupling between the injector and active regions, wherein the quantum cascade laser comprises a plurality of lower injector states and an upper laser state, where the coupling strength between each lower injector state and the upper laser state is at least about 10 meV and wherein the quantum cascade laser has a gain spectrum width of at least about 250 cm$^{-1}$ full width at half maximum.

13. The quantum cascade source according to claim 12, comprising a plurality of upper laser states and a plurality of lower laser states to provide a plurality of lasing transitions therebetween.

14. The quantum cascade source according to claim 13, wherein the quantum cascade laser has a gain spectrum width of about 400 cm$^{-1}$ full width at half maximum.

15. The quantum cascade source according to claim 12, wherein the plurality of lower injector states comprises two lower injector states, where the coupling strength between each lower injector state and the upper laser state is at least about 20 meV.

16. The quantum cascade source according to claim 12, comprising a coupling strength of at least about 10 meV between the injector and active regions.

17. The quantum cascade source according to claim 12, comprising a coupling strength of at least about 20 meV between the injector and active regions.

* * * * *